US012646565B2

(12) United States Patent
Tseng et al.

(10) Patent No.: US 12,646,565 B2
(45) Date of Patent: Jun. 2, 2026

(54) MEMORY DEVICE AND MEMORY SYSTEM

(71) Applicant: MACRONIX INTERNATIONAL CO., LTD., Hsinchu (TW)

(72) Inventors: Po-Hao Tseng, Taichung City (TW); Shao-Yu Fang, New Taipei City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 95 days.

(21) Appl. No.: 18/809,437

(22) Filed: Aug. 20, 2024

(65) Prior Publication Data

US 2026/0057937 A1 Feb. 26, 2026

(51) Int. Cl.
*G11C 5/06* (2006.01)
*G11C 16/04* (2006.01)

(52) U.S. Cl.
CPC .......... *G11C 16/0483* (2013.01); *G11C 5/063* (2013.01)

(58) Field of Classification Search
CPC .......................... G11C 16/0483; G11C 5/063
See application file for complete search history.

(56) References Cited

U.S. PATENT DOCUMENTS

| | | | |
|---|---|---|---|
| 2017/0069360 A1 | 3/2017 | Chen | |
| 2022/0284964 A1* | 9/2022 | Wang | H10B 41/27 |
| 2023/0036141 A1* | 2/2023 | Tseng | G11C 16/26 |
| 2023/0238037 A1 | 7/2023 | Tseng | |

FOREIGN PATENT DOCUMENTS

TW I595483 B 8/2017

OTHER PUBLICATIONS

P.-H. Tseng et al., "In-Memory Approximate Computing Architecture Based on 3D-NAND Flash Memories," 2022 Symposium on VLSI Technology & Circuits Digest of Technical Papers, 2022, pp. 270-271.

* cited by examiner

*Primary Examiner* — Xiaochun L Chen
(74) *Attorney, Agent, or Firm* — McClure, Qualey & Rodack, LLP

(57) ABSTRACT

A memory device includes a memory string. The memory string includes first switch elements and second switch elements. The second switch elements are arranged alternately and coupled in series with the first switch elements. When the memory string has a first conductance, each switch element of the first switch elements has a first threshold voltage level and each switch element of the second switch elements has a second threshold voltage level, when the memory string has a second conductance, each switch element of a first portion of the first switch elements has the second threshold voltage level and each switch element of a second portion of the second switch elements has the first threshold voltage level, the first conductance is smaller than the second conductance, and the first threshold voltage level is larger than the second threshold voltage level.

19 Claims, 31 Drawing Sheets

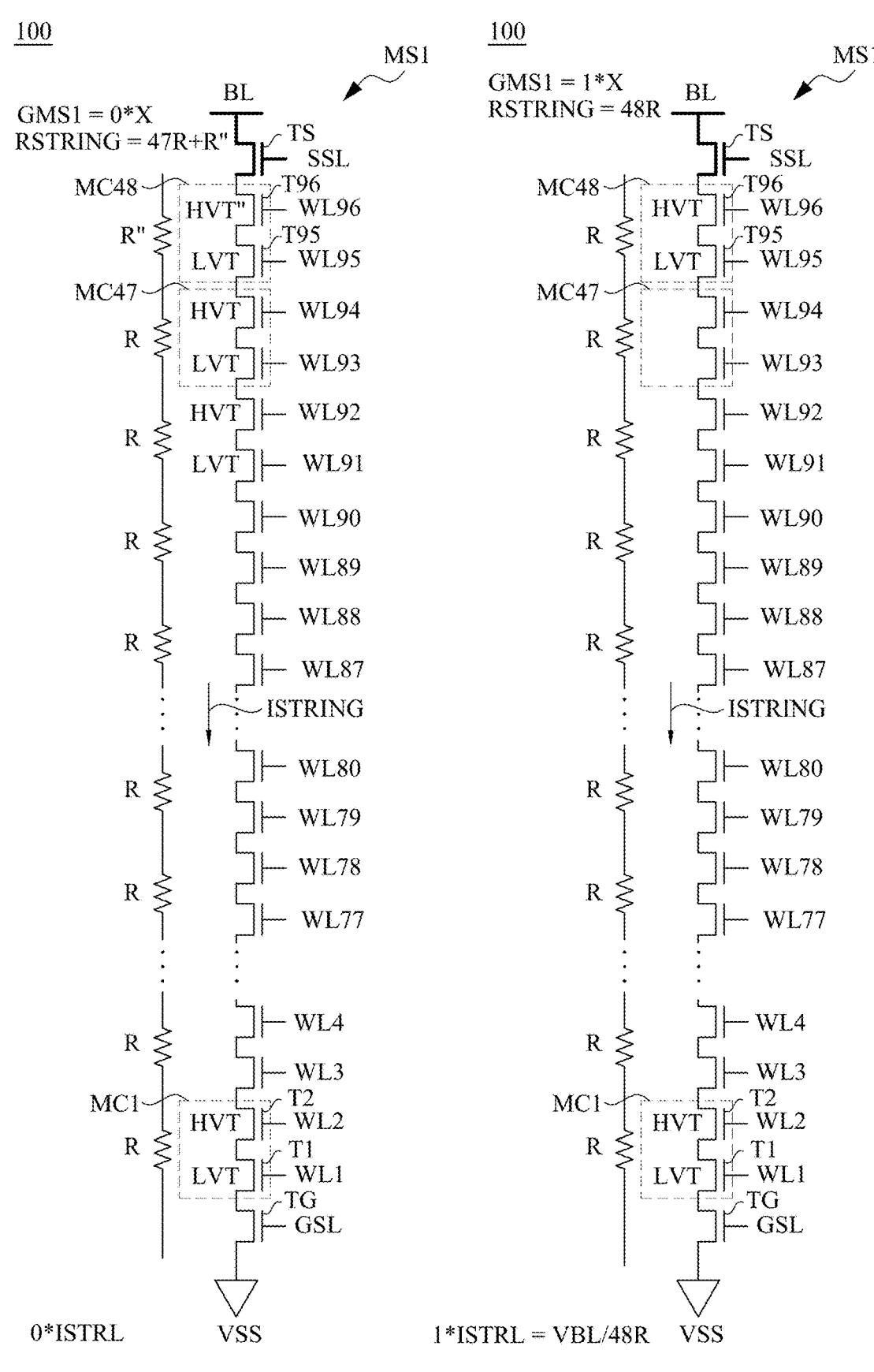
FIG. 1A                  FIG. 1B

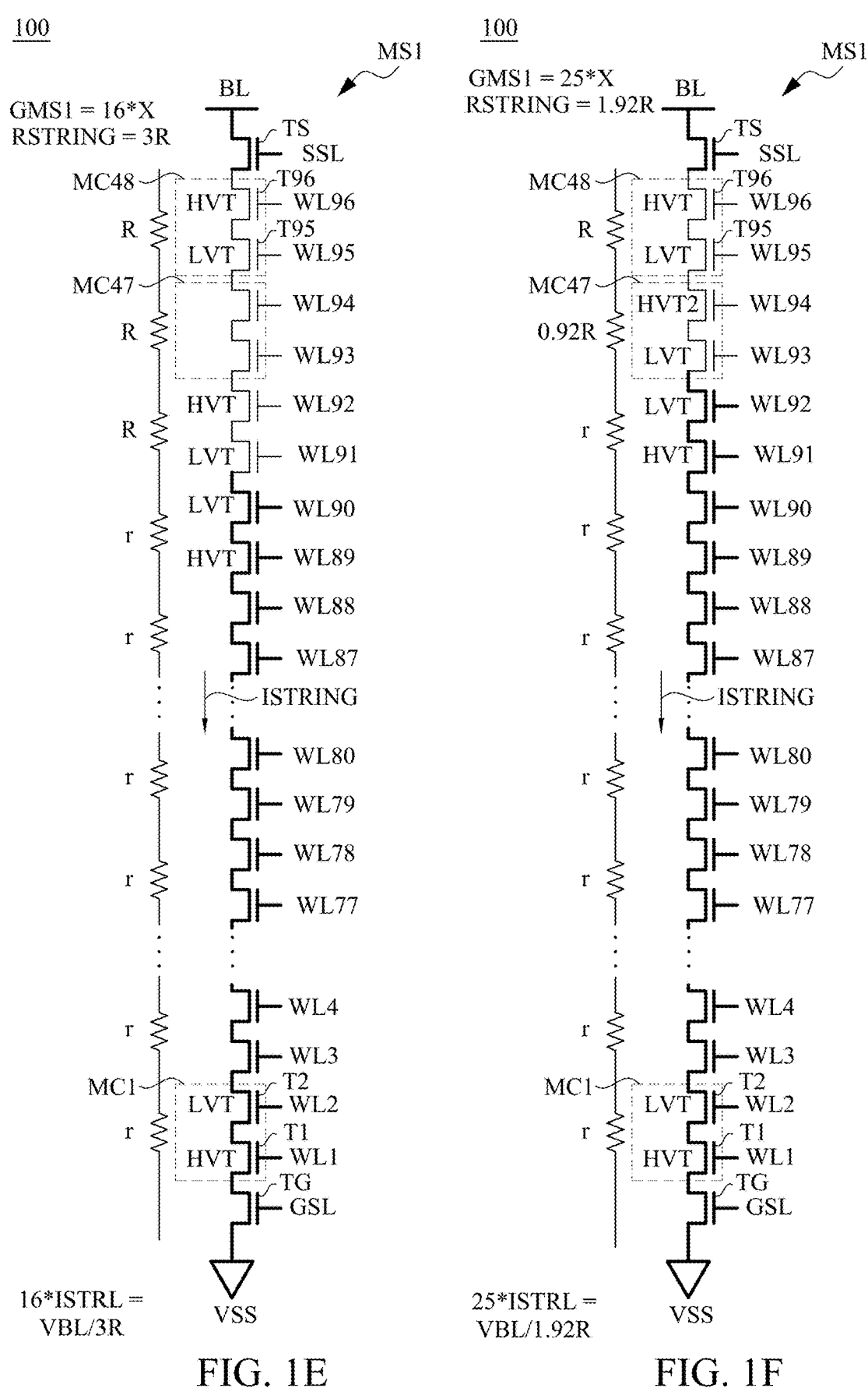
FIG. 1E                  FIG. 1F

MC1

MC1

$$ISTRL = VBL/(n)R \Rightarrow 2^2\ ISTRL = VBL/(n/4)R \Rightarrow 3^2\ ISTRL = VBL/(n/9)R \Rightarrow 4^2\ ISTRL = VBL/(n/16)R$$

$$\Rightarrow 5^2\ ISTRL = VBL/(n/25)R \Rightarrow 6^2\ ISTRL = VBL/(n/36)R \Rightarrow 7^2\ ISTRL = VBL/(n/49)R \Rightarrow 8^2\ ISTRL = VBL/(n/64)R$$

$$\Rightarrow 9^2\ ISTRL = VBL/(n/81)R \Rightarrow 10^2\ ISTRL = VBL/(n/100)R \quad \cdots\cdots \quad \Rightarrow m^2\ ISTRL = VBL/(n/(m)^2)R$$

Figure 5A:
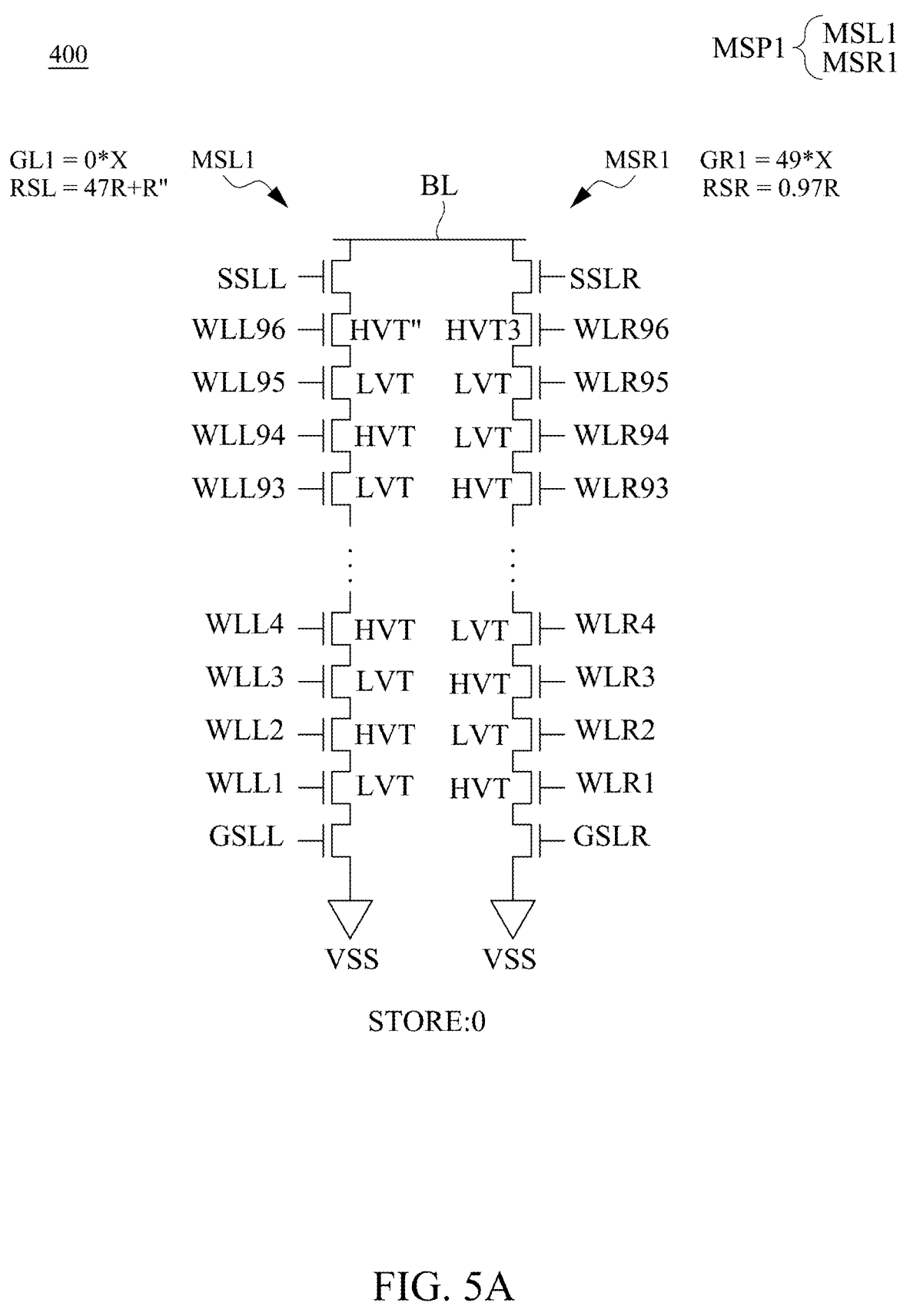

$$MSP1 \begin{cases} MSL1 \\ MSR1 \end{cases}$$

GL1 = 0*X          MSL1                          MSR1    GR1 = 49*X
RSL = 47R+R"                        BL                   RSR = 0.97R

SSLL —[                    ]— SSLR

WLL96 —[ HVT"    HVT3 ]— WLR96

WLL95 —[ LVT     LVT ]— WLR95

WLL94 —[ HVT     LVT ]— WLR94

WLL93 —[ LVT     HVT ]— WLR93

.                .

WLL4 —[ HVT     LVT ]— WLR4

WLL3 —[ LVT     HVT ]— WLR3

WLL2 —[ HVT     LVT ]— WLR2

WLL1 —[ LVT     HVT ]— WLR1

GSLL —[                    ]— GSLR

VSS              VSS

STORE:0

FIG. 5A $$MSP1 \begin{cases} MSL1 \\ MSR1 \end{cases}$$

Figure 5B:
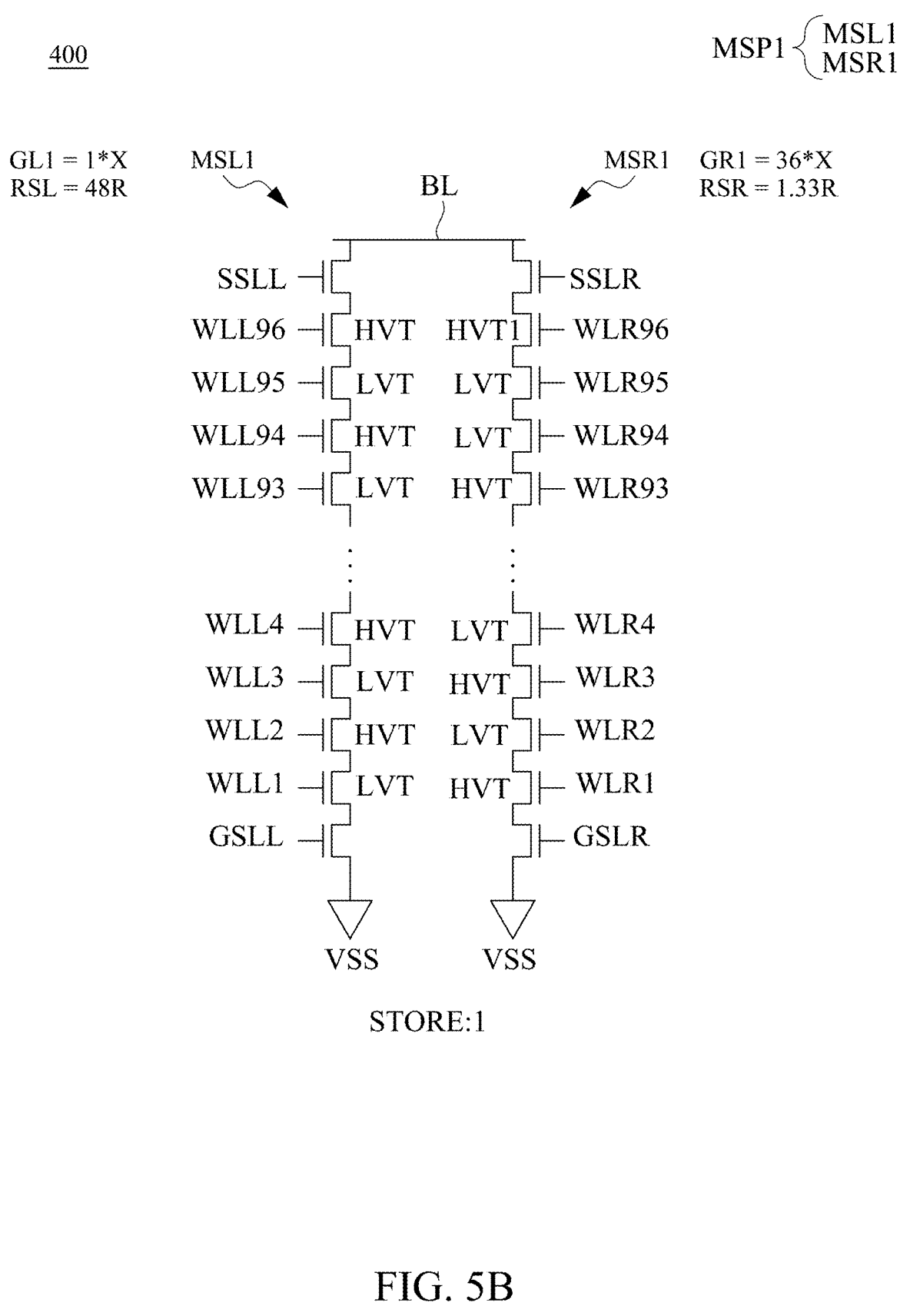

400

GL1 = 1*X    MSL1                MSR1    GR1 = 36*X
RSL = 48R           BL                  RSR = 1.33R

SSLL —       — SSLR

WLL96 — HVT   HVT1 — WLR96

WLL95 — LVT    LVT — WLR95

WLL94 — HVT    LVT — WLR94

WLL93 — LVT    HVT — WLR93

⋮          ⋮

WLL4 — HVT    LVT — WLR4

WLL3 — LVT    HVT — WLR3

WLL2 — HVT    LVT — WLR2

WLL1 — LVT    HVT — WLR1

GSLL —       — GSLR

VSS       VSS

STORE:1

Figure 5C:
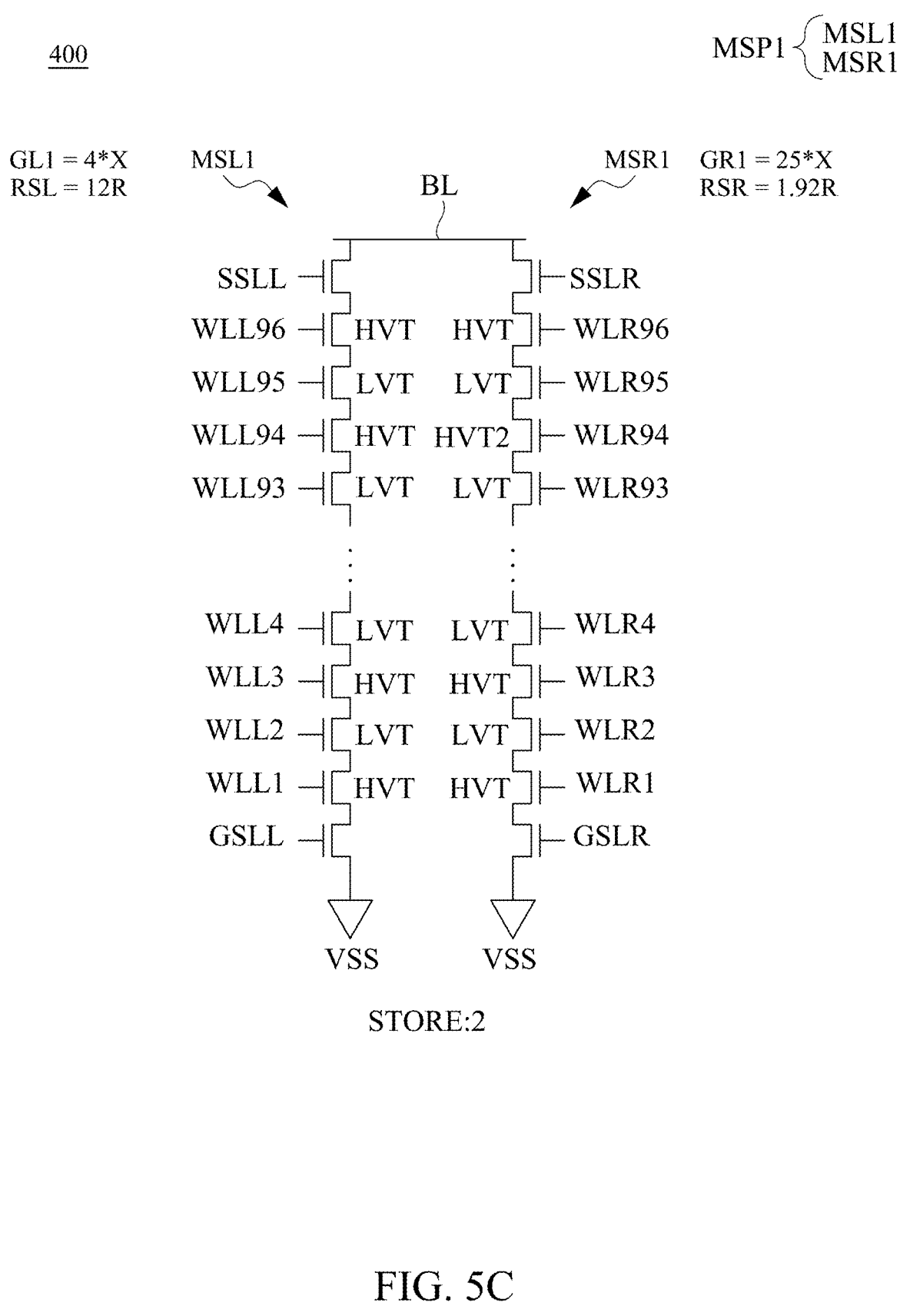

$$MSP1 \begin{cases} MSL1 \\ MSR1 \end{cases}$$

GL1 = 4*X          MSL1                    MSR1    GR1 = 25*X
RSL = 12R                        BL                RSR = 1.92R

SSLL ─┤[            ]├─ SSLR

WLL96 ─┤[ HVT    HVT ]├─ WLR96

WLL95 ─┤[ LVT    LVT ]├─ WLR95

WLL94 ─┤[ HVT   HVT2 ]├─ WLR94

WLL93 ─┤[ LVT    LVT ]├─ WLR93

⋮        ⋮

WLL4 ─┤[ LVT    LVT ]├─ WLR4

WLL3 ─┤[ HVT    HVT ]├─ WLR3

WLL2 ─┤[ LVT    LVT ]├─ WLR2

WLL1 ─┤[ HVT    HVT ]├─ WLR1

GSLL ─┤[            ]├─ GSLR

▽              ▽
       VSS            VSS

STORE:2

FIG. 5C $$MSP1 \begin{cases} MSL1 \\ MSR1 \end{cases}$$

Figure 5D:
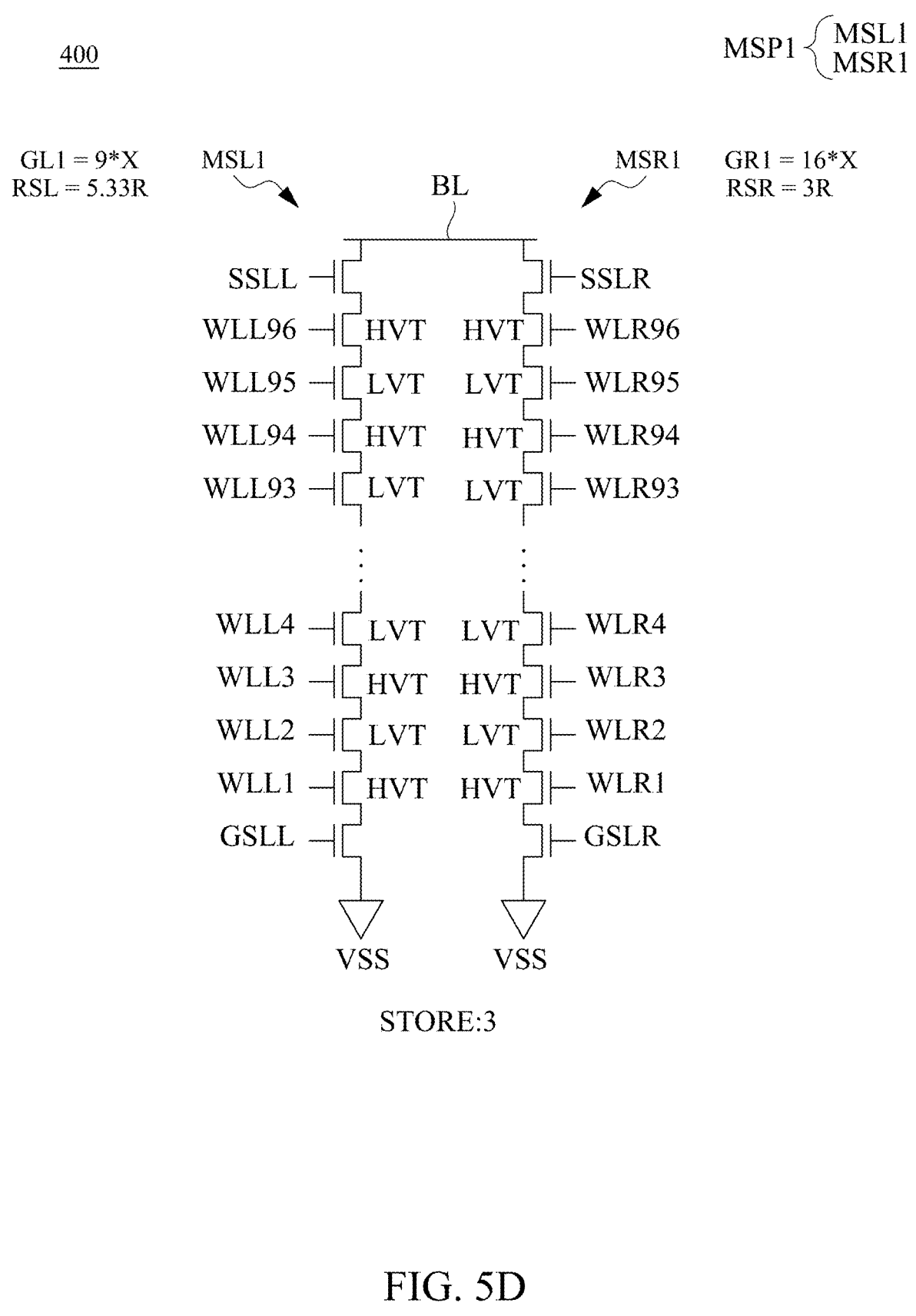

400

GL1 = 9*X    MSL1            MSR1    GR1 = 16*X
RSL = 5.33R          BL              RSR = 3R

| SSLL | | | SSLR |
| WLL96 | HVT | HVT | WLR96 |
| WLL95 | LVT | LVT | WLR95 |
| WLL94 | HVT | HVT | WLR94 |
| WLL93 | LVT | LVT | WLR93 |
| ⋮ | | | ⋮ |
| WLL4 | LVT | LVT | WLR4 |
| WLL3 | HVT | HVT | WLR3 |
| WLL2 | LVT | LVT | WLR2 |
| WLL1 | HVT | HVT | WLR1 |
| GSLL | | | GSLR |

VSS        VSS

STORE:3

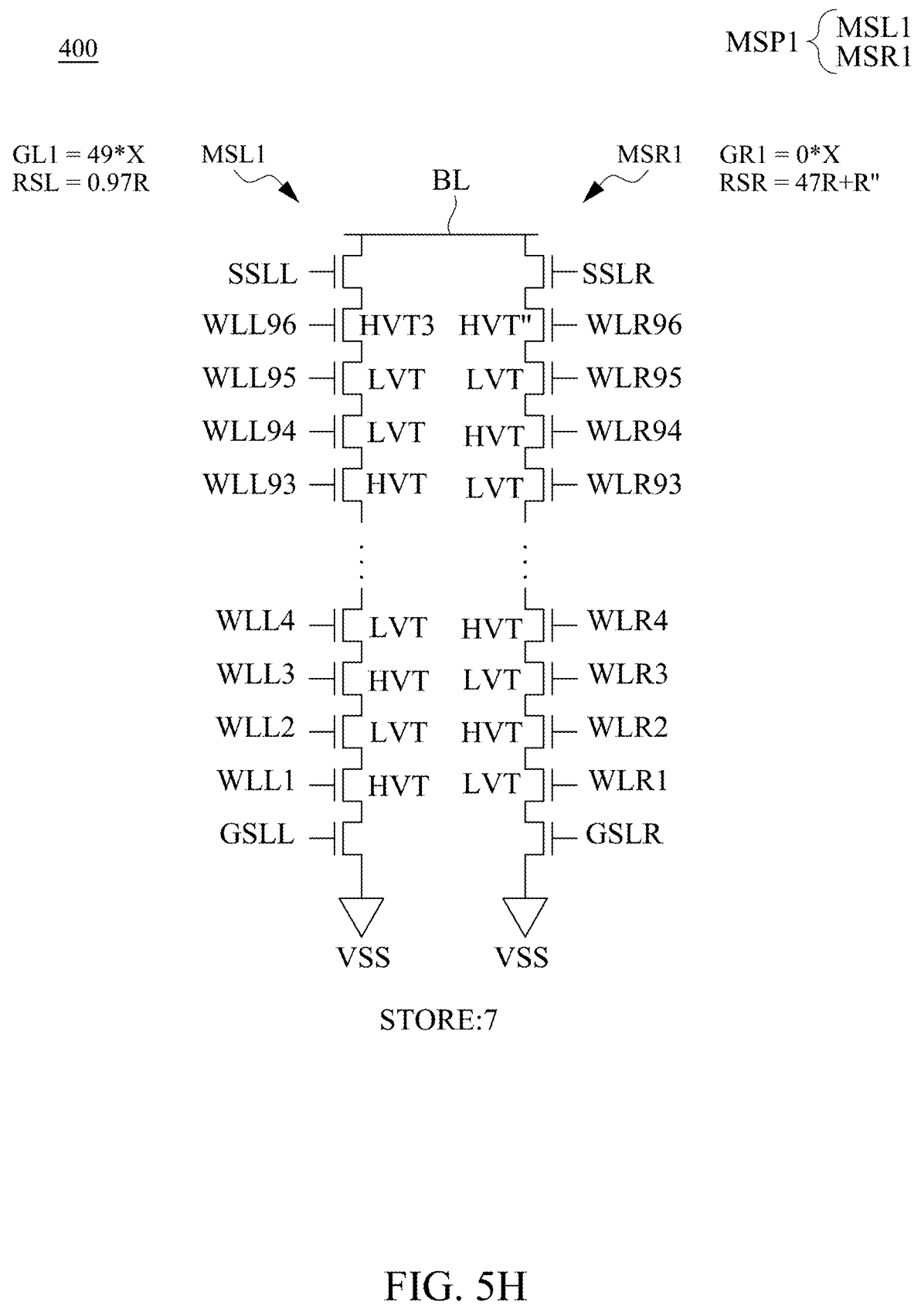

$$MSP1 \begin{cases} MSL1 \\ MSR1 \end{cases}$$

GL1 = 49*X     MSL1                    MSR1    GR1 = 0*X
RSL = 0.97R                   BL               RSR = 47R+R"

SSLL ─┤└              ┘├─ SSLR

WLL96 ─┤└ HVT3    HVT" ┘├─ WLR96

WLL95 ─┤└ LVT      LVT ┘├─ WLR95

WLL94 ─┤└ LVT      HVT ┘├─ WLR94

WLL93 ─┤└ HVT      LVT ┘├─ WLR93

· · ·

WLL4 ─┤└ LVT      HVT ┘├─ WLR4

WLL3 ─┤└ HVT      LVT ┘├─ WLR3

WLL2 ─┤└ LVT      HVT ┘├─ WLR2

WLL1 ─┤└ HVT      LVT ┘├─ WLR1

GSLL ─┤└              ┘├─ GSLR

VSS          VSS

STORE:7

FIG. 5H

| INPUT | ENCODE | LEFT STRING | RIGHT STRING |
|-------|--------|-------------|--------------|
| 0 | 0 | VH1, VH2, ..., VH1, VH2 SSLL ON | VH1, VH1, ..., VH1, VH1 SSLR CAN BE OFF |
| 1 | | | |
| 2 | | | |
| 3 | WILDCARD | VH1, VH1, ..., VH1, VH1 SSLL CAN BE OFF | VH1, VH1, ..., VH1, VH1 SSLR CAN BE OFF |
| 4 | | | |
| 5 | 7 | VH1, VH1, ..., VH1, VH1 SSLL CAN BE OFF | VH1, VH2, ..., VH1, VH2 SSLR ON |
| 6 | | | |
| 7 | | | |

| | | INPUT BIT | | | | | | | |
|---|---|---|---|---|---|---|---|---|---|
| | | 0 | 1 | 2 | 3 | 4 | 5 | 6 | 7 |
| STORE BIT | 0 | 0 | 1 | 4 | 9 | 16 | 25 | 36 | 49 |
| | 1 | 1 | 0 | 1 | 4 | 9 | 16 | 25 | 36 |
| | 2 | 4 | 1 | 0 | 1 | 4 | 9 | 16 | 25 |
| | 3 | 9 | 4 | 1 | 0 | 1 | 4 | 9 | 16 |
| | 4 | 16 | 9 | 4 | 1 | 0 | 1 | 4 | 9 |
| | 5 | 25 | 16 | 9 | 4 | 1 | 0 | 1 | 4 |
| | 6 | 36 | 25 | 16 | 9 | 4 | 1 | 0 | 1 |
| | 7 | 49 | 36 | 25 | 16 | 9 | 4 | 1 | 0 |

L63

L62

L61

602

| | | INPUT BIT | | | | | | | |
|---|---|---|---|---|---|---|---|---|---|
| | | 0 | 1 | 2 | 3 | 4 | 5 | 6 | 7 |
| STORE BIT | 0 | 0 | 0 | 0 | 0 | 0 | 49 | 49 | 49 |
| | 1 | 1 | 1 | 1 | 0 | 0 | 36 | 36 | 36 |
| | 2 | 4 | 4 | 4 | 0 | 0 | 25 | 25 | 25 |
| | 3 | 9 | 9 | 9 | 0 | 0 | 16 | 16 | 16 |
| | 4 | 16 | 16 | 16 | 0 | 0 | 9 | 9 | 9 |
| | 5 | 25 | 25 | 25 | 0 | 0 | 4 | 4 | 4 |
| | 6 | 36 | 36 | 36 | 0 | 0 | 1 | 1 | 1 |
| | 7 | 49 | 49 | 49 | 0 | 0 | 0 | 0 | 0 |

MSP1 { MSL1
       MSR1

STORE:0                                              STORE:N

LEFT STRING : $G=0*X$, $G=2^2*X$, $G=3^2*X$, ......, $G=N^2*X$

RIGHT STRING : $G=N^2*X$, $G=3^2*X$, $G=2^2*X$, ......, $G=0*X$

FIG. 7B

| INPUT | ENCODE | LEFT STRING | RIGHT STRING |
|---|---|---|---|
| 0<br>1<br>2<br>3 | 0 | VH1, VH2, ..., VH1, VH2<br>SSLL ON | VH1, VH1, ..., VH1, VH1<br>SSLR CAN BE OFF |
| 4<br>5<br>6<br>:<br>(N-4) | WILDCARD | VH1, VH1, ..., VH1, VH1<br>SSLL CAN BE OFF | VH1, VH1, ..., VH1, VH1<br>SSLR CAN BE OFF |
| (N-3)<br>(N-2)<br>(N-1)<br>N | N | VH1, VH1, ..., VH1, VH1<br>SSLL CAN BE OFF | VH1, VH2, ..., VH1, VH2<br>SSLR ON |

FIG. 7C

MEMORY DEVICE AND MEMORY SYSTEM

BACKGROUND

Technical Field

The present disclosure relates to a memory technique. More particularly, the present disclosure relates to a memory device and a memory system.

Description of Related Art

The Euclidean distance is the shortest distance between two points in the Euclidean space, and can be used as a common metric to measure the similarity between two data points. The Euclidean distance is also used in various fields such as geometry, data mining, deep learning and others. However, a memory device configured for computing the Euclidean distance may have poor reliability and complicate operations. Thus, techniques associated with the designing memory device with good reliability and simple operations for calculating the Euclidean distance are important issues in the field.

SUMMARY

The present disclosure provides a memory device. The memory device includes a memory string. The memory string includes a plurality of first switch elements and a plurality of second switch elements. The plurality of second switch elements is arranged alternately and coupled in series with the plurality of first switch elements. When the memory string has a first conductance, each switch element of the plurality of first switch elements has a first threshold voltage level and each switch element of the plurality of second switch elements has a second threshold voltage level, when the memory string has a second conductance, each switch element of a first portion of the plurality of first switch elements has the second threshold voltage level and each switch element of a second portion of the plurality of second switch elements has the first threshold voltage level, the first conductance is smaller than the second conductance, and the first threshold voltage level is larger than the second threshold voltage level.

In some embodiments, when the memory string has a third conductance, one of the plurality of first switch elements has a third threshold voltage level, the second conductance is larger than the third conductance, and the third threshold voltage level is larger than the first threshold voltage level.

In some embodiments, when the memory string has a third conductance, each switch element of a third portion of the plurality of first switch elements has the second threshold voltage level, and each switch element of a fourth portion of the plurality of second switch elements has the first threshold voltage level, the third conductance is larger than the second conductance, and a quantity of switch elements of the third portion is larger than a quantity of switch elements of the first portion, and a quantity of switch elements of the fourth portion is larger than a quantity of switch elements of the second portion.

In some embodiments, when the memory string has a third conductance, a third switch element of the plurality of first switch elements has a third threshold voltage level, the third conductance is larger than the second conductance, and the third threshold voltage level is larger than the first threshold voltage level.

In some embodiments, when the memory string has a fourth conductance, the third switch element has a fourth threshold voltage level, the fourth conductance is larger than the third conductance, the first threshold voltage level is larger than the fourth threshold voltage level, and the second threshold voltage level is smaller than the fourth threshold voltage level.

The present disclosure provides a memory device. The memory device includes: a first memory string configured to receive a plurality of first word line signals; and a second memory string coupled in parallel with the first memory string, and configured to receive a plurality of second word line signals. The plurality of first word line signals and the plurality of second word line signals correspond to an input bit, when the input bit has a first encode value, each of a first portion of the plurality of first word line signals has a first voltage level, each of a second portion of the plurality of first word line signals has a second voltage level, and each of the plurality of second word line signals has the first voltage level, when the input bit has a second encode value, each of a third portion of the plurality of second word line signals has the first voltage level, each of a fourth portion of the plurality of second word line signals has the second voltage level, and each of the plurality of first word line signals has the first voltage level, and the first encode value is different from the second encode value.

In some embodiments, the second voltage level is larger than the first voltage level.

In some embodiments, when the input bit has a wildcard encode value, each of the plurality of first word line signals and the plurality of second word line signals has the first voltage level.

In some embodiments, when the input bit has the first encode value, the input bit has a first logic value, when the input bit has the wildcard encode value, the input bit has a second logic value larger than the first logic value, and the input bit has the second encode value, the input bit has a third logic value larger than the second logic value.

In some embodiments, the first memory string and the second memory string are further configured to store a store bit, when the store bit has a first logic value, the first memory string and the second memory string have a first conductance and a second conductance, respectively, when the store bit has a second logic value, the first memory string and the second memory string have the second conductance and the first conductance, respectively, and the second conductance is larger than the first conductance.

In some embodiments, the second conductance is proportional to a square of a difference between the second logic value and the first logic value.

In some embodiments, when the store bit has a third logic value, the first memory string and the second memory string have a third conductance and a fourth conductance, respectively, the third conductance is proportional to a square of a difference between the third logic value and the first logic value, and the fourth conductance is proportional to a square of a difference between the third logic value and the second logic value.

In some embodiments, when the store bit has a fourth logic value, the first memory string and the second memory string have a fifth conductance and a sixth conductance, respectively, the fifth conductance is proportional to a square of a difference between the fourth logic value and the first logic value, and the sixth conductance is proportional to a square of a difference between the fourth logic value and the second logic value.

In some embodiments, a difference between the fourth logic value and the third logic value is equal to the difference between the third logic value and the first logic value.

In some embodiments, the first memory string and the second memory string are further configured to generate a first string current signal and a second string current signal, when the input bit has the first encode value, a current level the first string current signal is proportional a square of a difference between a logic value of the input bit and a logic value of the store bit, and when the input bit has the second encode value, a current level the second string current signal is proportional the square of the difference between the logic value of the input bit and the logic value of the store bit.

In some embodiments, when the input bit has the first encode value, the second string current signal has a zero current level, and when the input bit has the second encode value, the first string current signal has the zero current level.

In some embodiments, when the input bit has the wildcard encode value, each of the first string current signal and the second string current signal has a zero current level.

The present disclosure provides a memory system. The memory system includes a plurality of memory blocks configured to receive a plurality of string select line signals, respectively; and a sensing device configured to receive a plurality of bit line signals from the plurality of memory blocks, wherein the plurality of memory blocks comprises a plurality of first memory string pairs, the plurality of first memory string pairs are configured to store a plurality of first store bits, respectively, and the plurality of first memory string pairs are configured to compare the plurality of first store bits and a plurality of input bits, to generate a first bit line signal of the plurality of bit line signals.

In some embodiments, the plurality of memory blocks further comprises a plurality of second memory string pairs, the plurality of second memory string pairs are configured to store a plurality of second store bits, respectively, the plurality of second memory string pairs are configured to compare the plurality of second store bits and the plurality of input bits, to generate a second bit line signal of the plurality of bit line signals.

In some embodiments, a quantity of the plurality of first memory string pairs is an half of a quantity of the plurality of memory blocks.

It is to be understood that both the foregoing general description and the following detailed description are examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1H are schematic diagrams of a part of a memory device 100 performing encoding operation, illustrated according to some embodiments of present disclosure.

FIG. 3J is a schematic diagram of a memory device performing encoding operation, illustrated according to some embodiments of present disclosure.

FIG. 5A to FIG. 5H are schematic diagrams of the memory device storing the store bit of different logic values, illustrated according to some embodiments of present disclosure.

FIG. 6A is a schematic diagram of various encoding conditions of the memory device, illustrated according to some embodiments of present disclosure.

FIG. 6C is a comparison diagram of pseudo-Euclidean distance computation of the memory device and ideal Euclidean distance computation, illustrated according to some embodiments of present disclosure.

FIG. 7B is a schematic diagram of the store bit of the memory device having N levels of logic values, illustrated according to some embodiments of present disclosure.

FIG. 7C is a schematic diagram of various encoding conditions of the memory device, illustrated according to some embodiments of present disclosure.

DETAILED DESCRIPTION

Figures 1C, 1D:
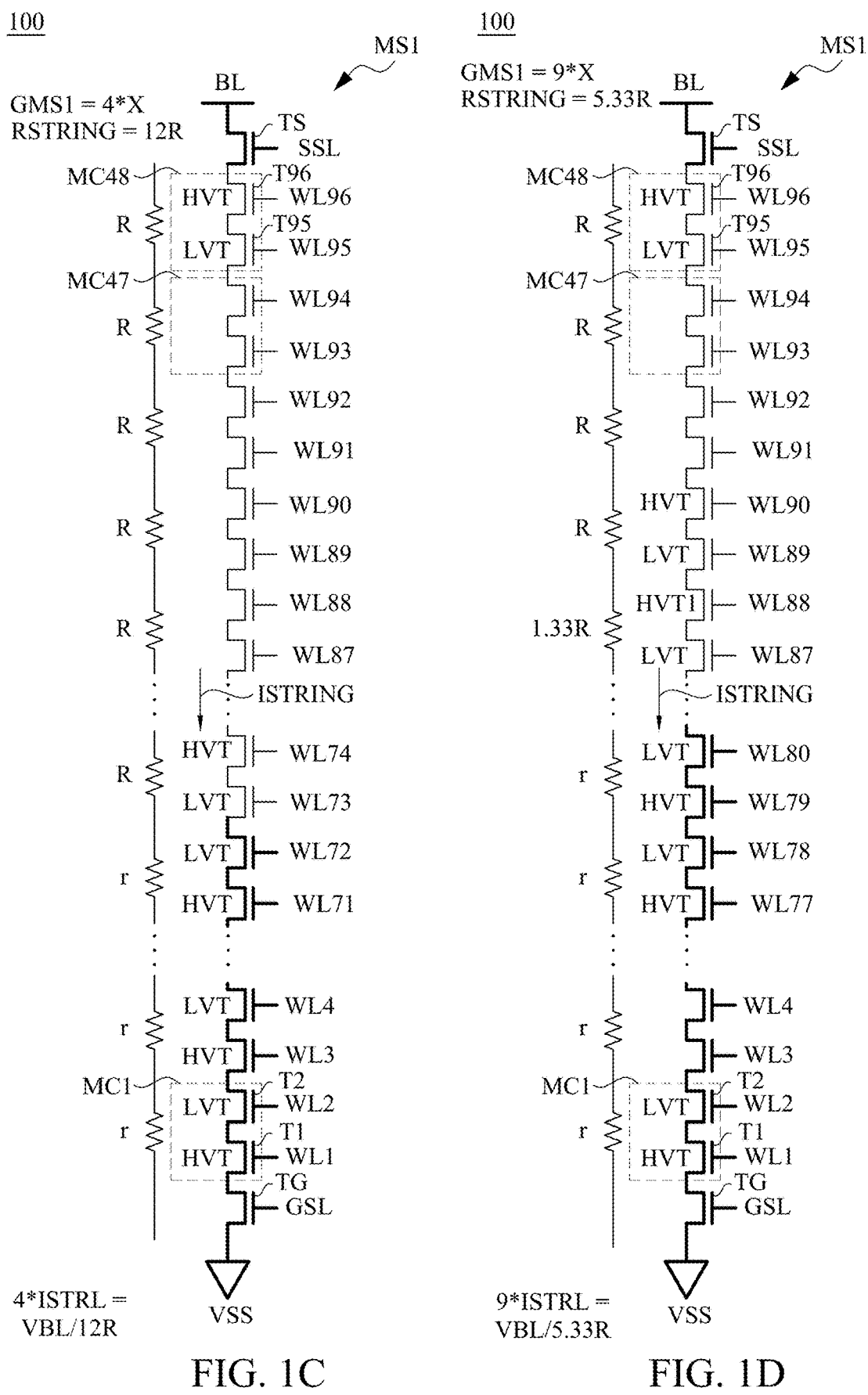

In the present disclosure, when an element is referred to as "connected" or "coupled", it may mean "electrically connected" or "electrically coupled". "Connected" or "coupled" can also be used to indicate that two or more components operate or interact with each other. In addition, although the terms "first", "second", and the like are used in the present disclosure to describe different elements, the terms are used only to distinguish the elements or operations described in the same technical terms. The use of the term is not intended to be a limitation of the present disclosure.

Unless otherwise defined, all terms (including technical and scientific terms) used in the present disclosure have the same meaning as commonly understood by the ordinary skilled person to which the concept of the present invention belongs. It will be further understood that terms (such as those defined in commonly used dictionaries) should be interpreted as having a meaning consistent with its meaning in the related technology and/or the context of this specification and not it should be interpreted in an idealized or overly formal sense, unless it is clearly defined as such in this article.

The terms used in the present disclosure are only used for the purpose of describing specific embodiments and are not intended to limit the embodiments. As used in the present disclosure, the singular forms "a", "one" and "the" are also intended to include plural forms, unless the context clearly indicates otherwise. It will be further understood that when used in this specification, the terms "comprises (comprising)" and/or "includes (including)" designate the existence of stated features, steps, operations, elements and/or components, but the existence or addition of one or more other features, steps, operations, elements, components, and/or groups thereof are not excluded.

Hereinafter multiple embodiments of the present disclosure will be disclosed with schema, as clearly stated, the details in many practices it will be explained in the following description. It should be appreciated, however, that the details in these practices is not applied to limit the present disclosure. Also, it is to say, in some embodiments of the present disclosure, the details in these practices are non-essential. In addition, for the sake of simplifying schema, some known usual structures and element in the drawings by a manner of simply illustrating for it.

FIG. 1A to FIG. 1H are schematic diagrams of a part of a memory device 100 performing encoding operation, illustrated according to some embodiments of present disclosure. In some embodiments, the memory device 100 includes multiple memory strings, such as the memory string MS1 shown in FIG. 1A. The memory string MS1 includes switch elements TR1-TR96. The memory string MS1 is configured to generate a string current signal ISTRING passing through the memory string MS1 according to a voltage level VBL of a bit line signal and a resistance of the memory string MS1 itself.

As shown in FIG. 1A, the memory string MS1 includes switch elements TG, T1-T96 and TS. However, the embodiments of present disclosure are not limited to this. In various embodiments, the memory string can include various quantities of switch elements, that is, 96 can be substituted by other positive integers. In various embodiments, the switch elements T1-T96 can be implemented by N-type metal-oxide-semiconductor (NMOS) transistors, and can also be implemented by P-type metal-oxide-semiconductor (PMOS) transistors.

As shown in FIG. 1A, the switch elements TG, T1-T96 and TS are coupled to each other in series. A terminal of the switch element TS is configured to output the bit line signal BL, and another terminal of the switch element TS is coupled to a terminal of the switch element T96. Another terminal of the switch element T96 is coupled to a terminal of the switch element T95, and so on. A terminal of the switch element T1 is coupled to a terminal of the switch element T2, and another terminal of the switch element T1 is coupled to a terminal of the switch element TG. Another terminal of the switch element TG is configured to receive a reference voltage signal VSS. The switch elements T1-T96 are arranged in order. Alternatively stated, the odd switch elements T1, T3, . . . , T93 and T95 and the even switch elements T2, T4, . . . , T94 and T96 are arranged alternately.

Control terminals of the switch elements TG, T1-T96 and TS are configured to receive a gate select line signal GSL, word line signals WL1-WL96 and a string select line signal SSL, respectively. In some embodiments, the control terminals are referred to as gate terminals.

In some embodiments, the reference voltage signal VSS has a ground voltage level. During operations, the bit line signal BL has the voltage level VBL higher than the ground voltage level, to generate the string current signal ISTRING.

In some embodiments, two adjacent switch elements can operate as one memory cell. For example, the switch elements T96 and T95 can operate as a memory cell MC48. The switch elements T94 and T93 can operate as a memory cell MC47, and so on. The switch elements T2 and T1 can operate as a memory cell MC1. The switch elements can have various threshold voltage levels to store different logic values. In some embodiments, the memory cells are referred to as Euclidean distance in-memory searching (IMS) cells.

In some embodiments, the IMS cells can be implemented by floating gate memory, split-gate memory, silicon-oxide-nitride-oxide-silicon (SONOS) memory, floating dot memory, dynamic random-access memory (DRAM) and/or other devices similar with DRAM. In some embodiments, the memory cell can also be implemented by emerging memory, such as ferroelectric field-effect transistor (FeFET). In various embodiments, the memory system can be implemented by 2D flash structure or 3D flash structure.

During the encoding operations, the switch elements T1-T96 are adjusted to corresponding threshold voltage levels, such that the string resistor RSTRING of the memory string has a corresponding resistance. A current value of the string current signal ISTRING is equal to the voltage level VBL divided by the resistance of the string resistor RSTRING.

In the embodiment shown in FIG. 1A, the switch element T96 has a threshold voltage level HVT". Each of the switch elements T95, T93, . . . , T3 and T1 has a threshold voltage level LVT, and each of switch elements T94, T92, . . . , T4 and T2 has a threshold voltage level HVT.

Correspondingly, the memory cell MC48 has a resistance R", and each of the memory cells MC1-MC47 has a resistance R. in response to the threshold voltage level HVT" is much larger than the threshold voltage level HVT, the resistance R" is much larger than the resistance R. For example, the resistance R" can be larger than the resistance R multiplied by one hundred. At this moment, the resistance of the string resistor RSTRING is equal to the resistance R multiplied by 47 plus R", that is, 47R+R". Correspondingly, a conductance GMS1 of the memory string MS1 is equal to a conductance X multiplied by zero. The current level of the string current signal ISTRING is equal to a current level ISTRL multiplied by zero.

In the embodiment shown in FIG. 1B, each of the switch elements T95, T93, . . . , T3 and T1 has the threshold voltage level LVT, and each of switch elements T96, T94, T92, . . . , T4 and T2 has the threshold voltage level HVT. Correspondingly, each of the memory cells MC1-MC48 has a resistance R.

At this moment, the resistance of the string resistor RSTRING is equal to the resistance R multiplied by 48, that is, 48R. Correspondingly, the conductance GMS1 is equal to the conductance X multiplied by 1. The current level of the string current signal ISTRING is equal to the current level ISTRL multiplied by 1, and equal to the voltage level VBL divided by the resistance 48R.

In the embodiment shown in FIG. 1C, each of the switch elements T95, T93, . . . , T75 and T73 has the threshold voltage level LVT, and each of switch elements T96, T94, T92, . . . , T76 and T74 has the threshold voltage level HVT. Correspondingly, each of the memory cells MC37-MC48 has the resistance R.

On the other hand, each of the switch elements T72, T70, . . . , T4 and T2 has the threshold voltage level LVT, and each of switch elements T71, T69, T67, . . . , T3 and T1 has the threshold voltage level HVT. Correspondingly, each of the memory cells MC1-MC36 has a resistance r. The resistance R is much larger than the resistance r. For example, the resistance R can be larger than the resistance r multiplied by one hundred. The resistance r is equal to zero resistance.

At this moment, the resistance of the string resistor RSTRING is equal to the resistance R multiplied by 12, that is, 12R. Correspondingly, the conductance GMS1 is equal to the conductance X multiplied by 4. The current level of the string current signal ISTRING is equal to the current level ISTRL multiplied by 4, and equal to the voltage level VBL divided by the resistance 12R.

In the embodiment shown in FIG. 1D, each of the switch elements T95, T93, T91 and T89 has the threshold voltage level LVT, and each of switch elements T96, T94, T92 and T90 has the threshold voltage level HVT. Correspondingly, each of the memory cells MC45-MC48 has the resistance R.

Furthermore, the switch elements T88 and T87 have threshold voltage levels HVT1 and LVT, respectively, such that the resistance of the memory cell MC44 is equal to the resistance R multiplied by 1.33, that is, 1.33R. In which the threshold voltage level HVT1 is larger than the threshold voltage level HVT.

On the other hand, each of the switch elements T86, T84, . . . , T4 and T2 has the threshold voltage level LVT, and each of switch elements T85, T83, . . . , T3 and T1 has the threshold voltage level HVT. Correspondingly, each of the memory cells MC1-MC43 has the resistance r.

At this moment, the resistance of the string resistor RSTRING is equal to the resistance R multiplied by 5.33, that is, 5.33R. Correspondingly, the conductance GMS1 is equal to the conductance X multiplied by 9. The current level of the string current signal ISTRING is equal to the current level ISTRL multiplied by 9, and equal to the voltage level VBL divided by the resistance 5.33R.

In the embodiment shown in FIG. 1E, each of the switch elements T95, T93 and T91 has the threshold voltage level LVT, and each of switch elements T96, T94 and T92 has the threshold voltage level HVT. Correspondingly, each of the memory cells MC46-MC48 has the resistance R.

On the other hand, each of the switch elements T90, T88, . . . , T4 and T2 has the threshold voltage level LVT, and each of switch elements T89, T87, . . . , T3 and T1 has the threshold voltage level HVT. Correspondingly, each of the memory cells MC1-MC45 has the resistance r.

At this moment, the resistance of the string resistor RSTRING is equal to the resistance R multiplied by 3, that is, 3R. Correspondingly, the conductance GMS1 is equal to the conductance X multiplied by 16. The current level of the string current signal ISTRING is equal to the current level ISTRL multiplied by 16, and equal to the voltage level VBL divided by the resistance 3R.

In the embodiment shown in FIG. 1F, each of the switch elements T95 and T96 have the threshold voltage levels LVT and HVT, respectively. Correspondingly, the memory cell MC48 has the resistance R.

Furthermore, the switch elements T93 and T94 have threshold voltage levels LVT and HVT2, respectively. The threshold voltage level HVT2 is smaller than the threshold voltage level HVT and is larger than the threshold voltage level LVT. Correspondingly, the resistance of the memory cell MC47 is equal to the resistor R multiplied by 0.92, that is, 0.92R.

On the other hand, each of the switch elements T92, T90, . . . , T4 and T2 has the threshold voltage level LVT, and each of switch elements T91, T89, . . . , T3 and T1 has the threshold voltage level HVT. Correspondingly, each of the memory cells MC1-MC46 has the resistance r.

At this moment, the resistance of the string resistor RSTRING is equal to the resistance R multiplied by 1.92, that is, 1.92R. Correspondingly, the conductance GMS1 is equal to the conductance X multiplied by 25. The current level of the string current signal ISTRING is equal to the current level ISTRL multiplied by 25, and equal to the voltage level VBL divided by the resistance 1.92R.

Figures 1G, 1H:
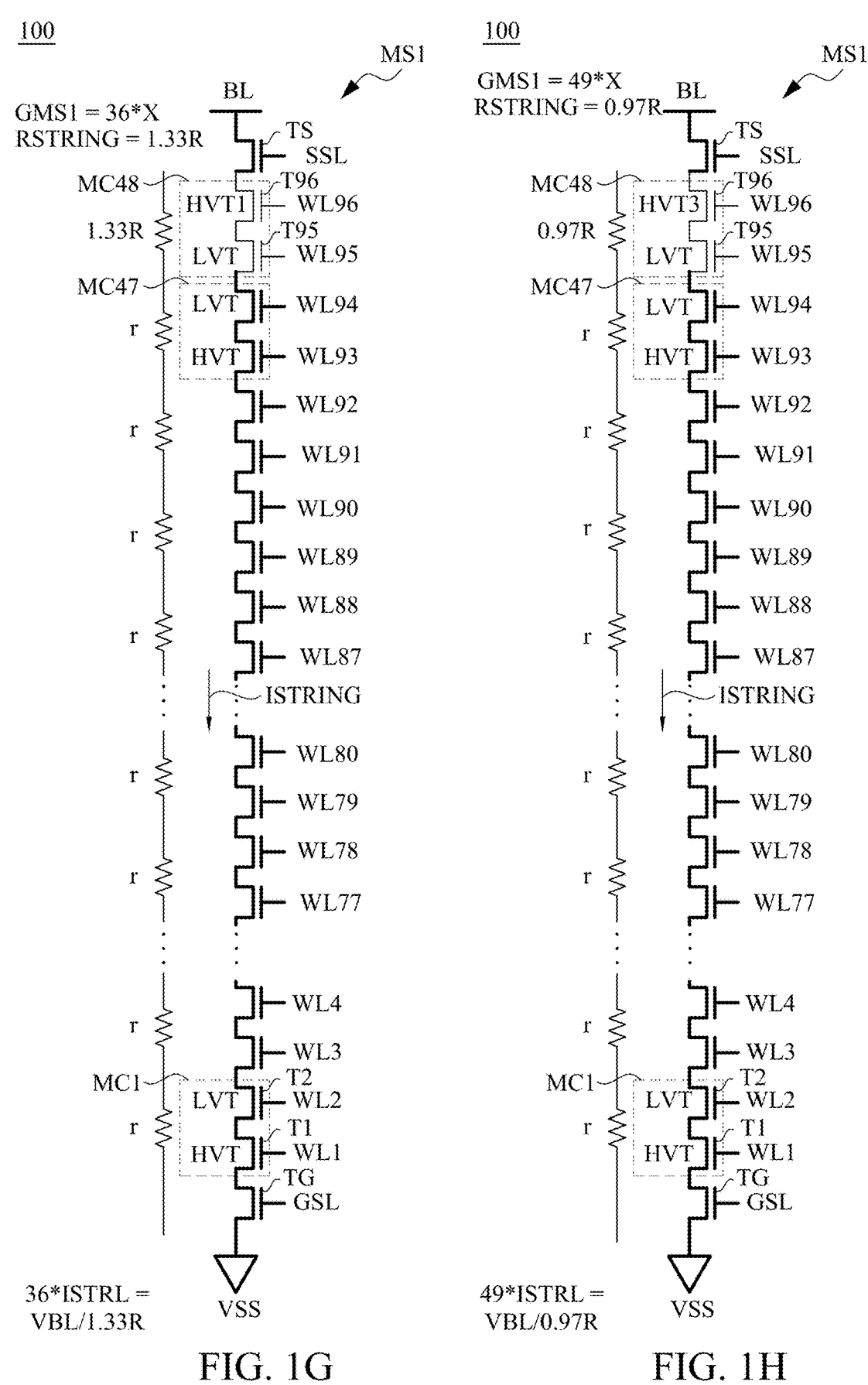

In the embodiment shown in FIG. 1G, each of the switch elements T95 and T96 have the threshold voltage levels LVT and HVT1, respectively. Correspondingly, the resistance of the memory cell MC48 is equal to the resistance R multiplied by 1.33, that is, 1.33R.

On the other hand, each of the switch elements T94, T92, . . . , T4 and T2 has the threshold voltage level LVT, and each of switch elements T93, T91, . . . , T3 and T1 has the threshold voltage level HVT. Correspondingly, each of the memory cells MC1-MC47 has the resistance r.

At this moment, the resistance of the string resistor RSTRING is equal to the resistance R multiplied by 1.33, that is, 1.33R. Correspondingly, the conductance GMS1 is equal to the conductance X multiplied by 36. The current level of the string current signal ISTRING is equal to the current level ISTRL multiplied by 36, and equal to the voltage level VBL divided by the resistance 1.33R.

In the embodiment shown in FIG. 1H, each of the switch elements T95 and T96 have the threshold voltage levels LVT and HVT3, respectively. The threshold voltage level HVT3 is larger than the threshold voltage level HVT2 and is smaller than the threshold voltage level HVT. Correspondingly, the resistance of the memory cell MC48 is equal to the resistance R multiplied by 0.97, that is, 0.97R.

On the other hand, each of the switch elements T94, T92, . . . , T4 and T2 has the threshold voltage level LVT, and each of switch elements T93, T91, . . . , T3 and T1 has the threshold voltage level HVT. Correspondingly, each of the memory cells MC1-MC47 has the resistance r.

At this moment, the resistance of the string resistor RSTRING is equal to the resistance R multiplied by 0.97, that is, 0.97R. Correspondingly, the conductance GMS1 is equal to the conductance X multiplied by 49. The current level of the string current signal ISTRING is equal to the current level ISTRL multiplied by 49, and equal to the voltage level VBL divided by the resistance 0.97R.

In the embodiments shown in FIG. 1A to FIG. 1H, the current level of the string current signal ISTRING is equal to the current level ISTRL multiplied by $0^2$, $1^2$, $2^2$, $3^2$, $4^2$, $5^2$, $6^2$ and $7^2$, respectively. As a result, the computation of 8 level Euclidean distance can be performed by the memory device 100. The approach described above are based on single level cell (SLC) mode for Euclidean distance IMS cell. Compared to multi-level cell (MLC) mode and triple level cell mode, the SLC mode can provide higher reliability.

Figures 2A, 2B:
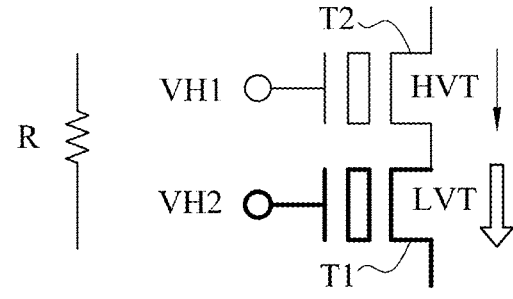
FIG. 2A and FIG. 2B are schematic diagrams of conditions of the memory cell having various resistances, illustrated according to some embodiments of present disclosure.

FIG. 2A and FIG. 2B are schematic diagrams of conditions of the memory cell MC1 having various resistances, illustrated according to some embodiments of present disclosure. In the embodiments shown in FIG. 2A and FIG. 2B, descriptions are given with the memory cell MC1 for example. However, other memory cell in the memory device, such as each of the memory cells MC2-MC48 also has features similar with the memory cell MC1.

In the embodiment shown in FIG. 2A, the switch elements T1 and T2 have the threshold voltage levels LVT and HVT, respectively. The word line signals WL1 and WL2 have search bias levels VH2 and VH1, respectively. In which the search bias level VH2 is larger than the search bias level VH1. Correspondingly, the switch element T2 has a smaller conductance, such that the memory cell MC1 has the resistance R.

In the embodiment shown in FIG. 2B, the switch elements T1 and T2 have the threshold voltage levels HVT and LVT, respectively. The word line signals WL1 and WL2 have search bias levels VH2 and VH1, respectively. Correspondingly, each of the switch elements T1 and T2 has a larger conductance, such that the memory cell MC1 has the resistance r.

Referring to FIG. 1A to FIG. 2B, in the embodiments shown in FIG. 1A to FIG. 1H, each of the word line signals WL1, WL3, . . . , WL93 and WL95 has the search bias level VH2, and each of the word line signals WL2, WL4, . . . , WL94 and WL96 has the search bias level VH1.

Figure 2C:
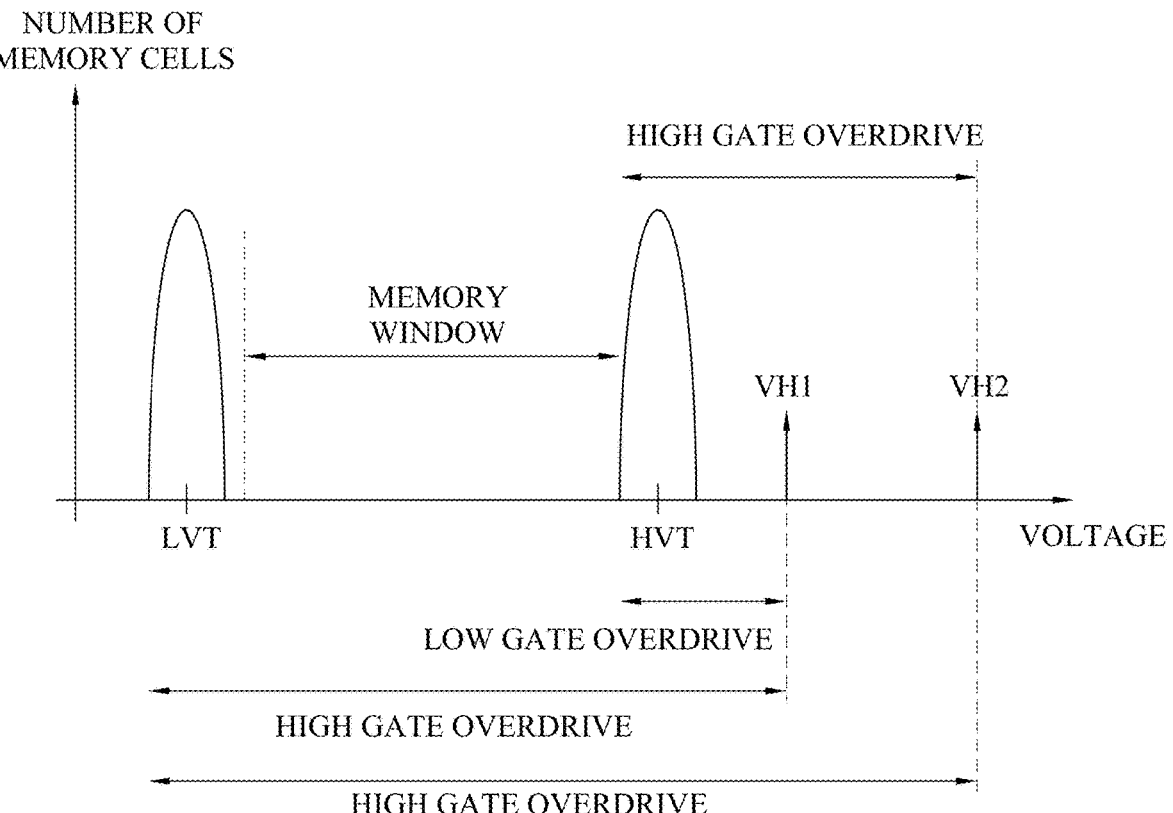
FIG. 2C is a schematic diagram of distributions of the threshold voltage levels of the memory cells, illustrated according to some embodiments of present disclosure.

FIG. 2C is a schematic diagram of distributions of the threshold voltage levels of the memory cells, illustrated according to some embodiments of present disclosure. A horizontal axis in FIG. 2C corresponds to voltages, and the vertical horizontal axis in FIG. 2C corresponds to quantities of the memory cells.

As shown in FIG. 2O, the threshold voltage levels LVT, HVT and the search bias levels VH1, VH2 are arranged in order along the horizontal direction. A memory window is between the threshold voltage levels LVT and HVT. For the threshold voltage level LVT, each of the search bias levels VH1 and VH2 is a high gate overdrive voltage. For the threshold voltage level HVT, the search bias levels VH1 and VH2 are a high gate overdrive voltage and a low gate overdrive voltage, respectively.

Figure 2D:
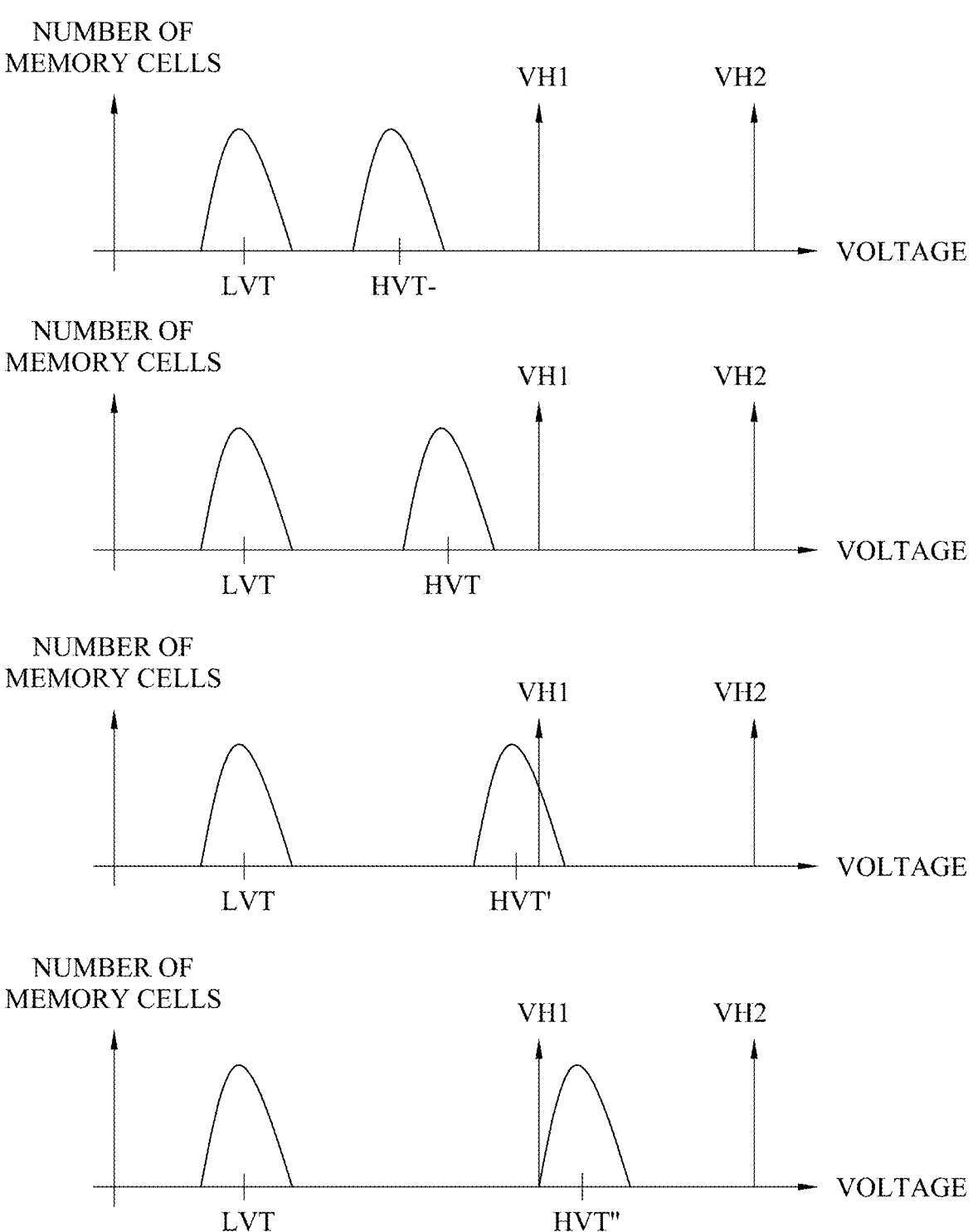
FIG. 2D is a schematic diagram of various distributions of the threshold voltage levels of the memory cells, illustrated according to some embodiments of present disclosure.

FIG. 2D is a schematic diagram of various distributions of the threshold voltage levels of the memory cells, illustrated according to some embodiments of present disclosure. A horizontal axis in FIG. 2D corresponds to voltages, and the vertical horizontal axis in FIG. 2D corresponds to quantities of the memory cells.

As shown in FIG. 2D, in various conditions, the memory cells can have various threshold voltage levels HVT-, HVT, HVT' and HVT". The threshold voltage level HVT is larger than the threshold voltage level HVT-. The threshold voltage level HVT' is larger than the threshold voltage level HVT. The threshold voltage level HVT" is larger than the threshold voltage level HVT'. Furthermore, each of the threshold voltage levels HVT-, HVT and HVT' is smaller than the search bias level VH1, and the threshold voltage level HVT" is larger than the search bias level VH1.

Referring to FIG. 2A and FIG. 2D, when the switch elements T1 and T2 have the threshold voltage levels LVT and HVT-, respectively, the resistance of the memory cell MC1 is equal to the resistance R multiplied by 0.5, that is, 0.5R. When the switch elements T1 and T2 have the threshold voltage levels LVT and HVT, respectively, the memory cell MC1 has the resistance R. When the switch elements T1 and T2 have the threshold voltage levels LVT and HVT', respectively, the resistance of the memory cell MC1 is equal to the resistance R multiplied by 1.5, that is, 1.5R. When the switch elements T1 and T2 have the threshold voltage levels LVT and HVT", respectively, the memory cell MC1 has the resistance R". Alternatively stated, when the threshold voltage level of the switch element T2 is larger, the resistance of the memory cell MC1 is larger.

Figures 3A, 3B:
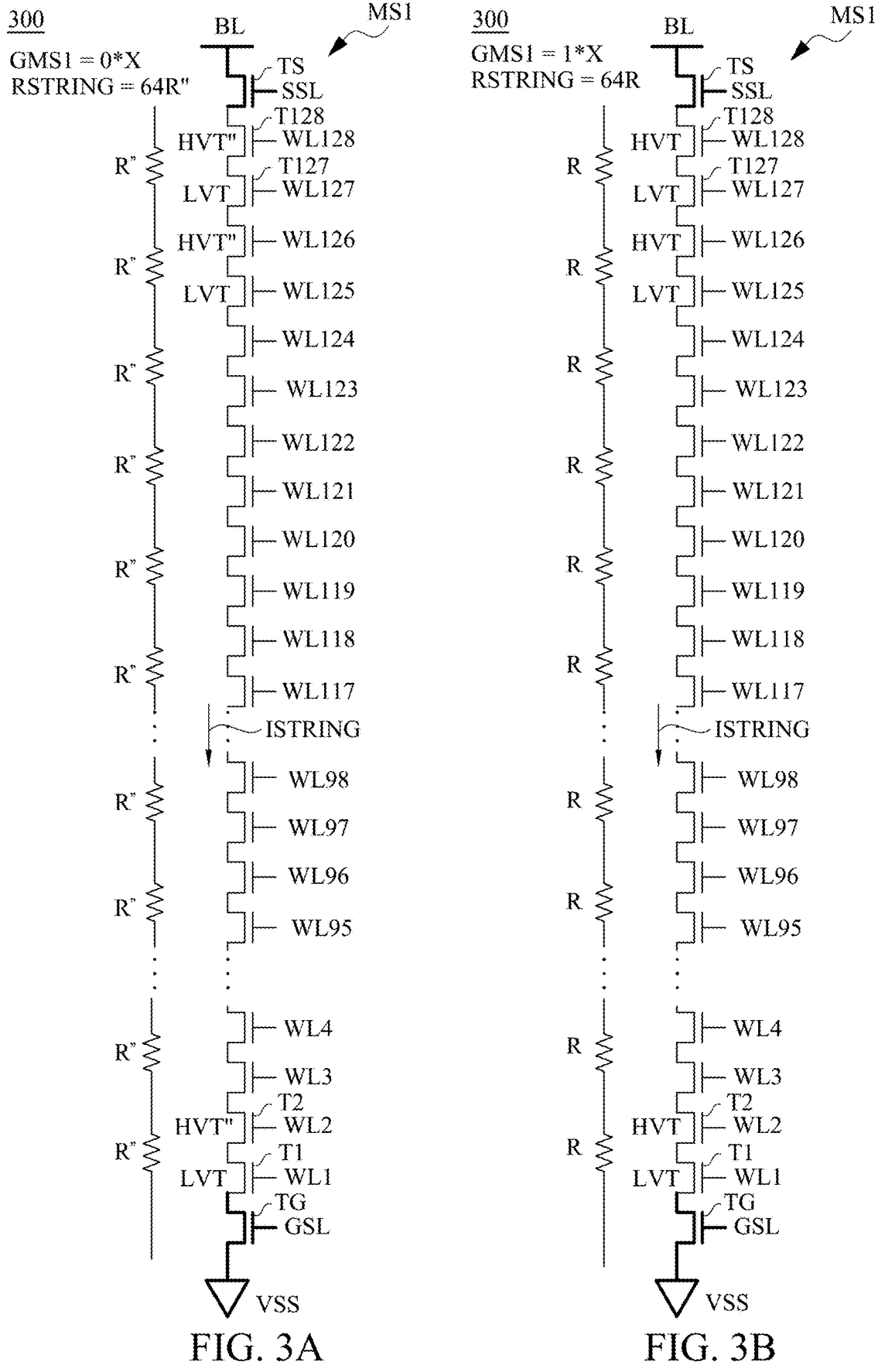
FIG. 3A to FIG. 3I are schematic diagrams of a part of a memory device performing encoding operation, illustrated according to some embodiments of present disclosure.

FIG. 3A to FIG. 3I are schematic diagrams of a part of a memory device 100 performing encoding operation, illustrated according to some embodiments of present disclosure. Referring to FIG. 1A and FIG. 3A, the memory device 300 is an alternative embodiment of the memory device 100. FIG. 3A follows a similar labeling convention to that of FIG. 1A. For brevity, the discussion will focus more on differences between FIG. 3A and FIG. 1A than on similarities.

Compared to the memory device 100, the memory string MS1 in the memory device 300 further includes switch elements T97-T128. However, the embodiments of present disclosure are not limited to this. In various embodiments, the memory string can include various quantities of switch elements, that is, 128 can be substituted by other positive integers.

As shown in FIG. 3A, the switch elements TG, T1-T128 and TS are coupled to each other in series. The switch element T1-T128 are arranged in order. Alternatively stated, the odd switch elements T1, T3, . . . , T125 and T127 and the even switch elements T2, T4, . . . , T126 and T128 are arranged alternately.

Similar with the switch elements T1-T96, adjacent two of the switch elements T97-T128 also can operate as one memory cell. For example, the switch elements T128 and T127 can operate as a memory cell MC64. The switch elements T126 and T125 can operate as a memory cell MC633, and so on. The switch elements T98 and T97 can operate as a memory cell MC49.

In the embodiments shown in FIG. 3A, each of the switch elements T127, T125, . . . , T3 and T1 has the threshold voltage level LVT, and each of switch elements T128, T126, . . . , T4 and T2 has the threshold voltage level HVT". Correspondingly, each of the memory cells MC1-MC64 has the resistance R". At this moment, the resistance of the string resistor RSTRING is equal to the resistance R" multiplied by 64, that is, 64R". Correspondingly, the conductance GMS1 of the memory string MS1 is equal to the conductance X multiplied by zero. The current level of the string current signal ISTRING is equal to the current level ISTRL multiplied by zero. In various embodiments, in response to one or more of the memory cells MC1-MC64 having the resistance R", the conductance GMS1 is equal to the conductance X multiplied by zero.

In the embodiments shown in FIG. 3B, each of the switch elements T127, T125, . . . , T3 and T1 has the threshold voltage level LVT, and each of switch elements T128, T126, . . . , T4 and T2 has the threshold voltage level HVT. Correspondingly, each of the memory cells MC1-MC64 has the resistance R.

At this moment, the resistance of the string resistor RSTRING is equal to the resistance R multiplied by 64, that is, 64R. Correspondingly, the conductance GMS1 is equal to the conductance X multiplied by 1. The current level of the string current signal ISTRING is equal to the current level ISTRL multiplied by 1, and is equal to the voltage level VBL divided by 64R.

Figures 3C, 3D:
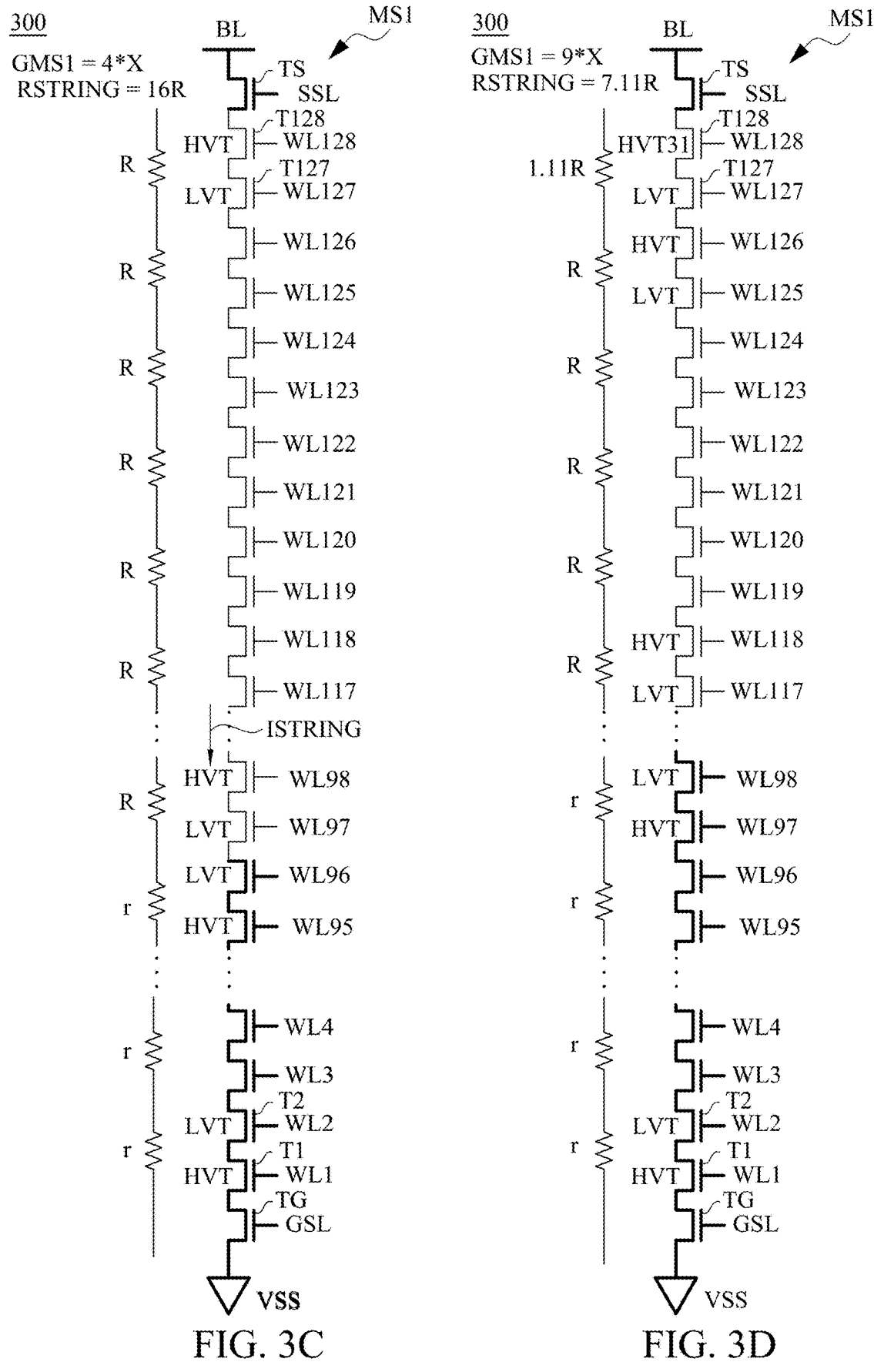

In the embodiments shown in FIG. 3C, each of the switch elements T127, T125, . . . , T99 and T97 has the threshold voltage level LVT, and each of switch elements T128, T126, . . . , T100 and T98 has the threshold voltage level HVT. Correspondingly, each of the memory cells MC49-MC64 has the resistance R.

On the other hand, each of the switch elements T96, T94, . . . , T4 and T2 has the threshold voltage level LVT, and each of switch elements T95, T93, . . . , T3 and T1 has the threshold voltage level HVT. Correspondingly, each of the memory cells MC1-MC48 has the resistance r.

At this moment, the resistance of the string resistor RSTRING is equal to the resistance R multiplied by 16, that is, 16R. Correspondingly, the conductance GMS1 is equal to the conductance X multiplied by 4. The current level of the string current signal ISTRING is equal to the current level ISTRL multiplied by 4, and is equal to the voltage level VBL divided by 16R.

In the embodiments shown in FIG. 3D, each of the switch elements T125, T123, . . . , T117 and T115 has the threshold voltage level LVT, and each of switch elements T126, T124, . . . , T118 and T116 has the threshold voltage level HVT. Correspondingly, each of the memory cells MC58-MC63 has the resistance R. Furthermore, the switch elements T128 and T127 has threshold voltage levels HVT31 and LVT, respectively. In which the threshold voltage level HVT31 is larger than the threshold voltage levels HVT. Correspondingly, the resistance of the memory cell MC64 is equal to the resistance R multiplied by 1.11, that is, 1.11R.

On the other hand, each of the switch elements T114, T112, . . . , T4 and T2 has the threshold voltage level LVT, and each of switch elements T113, T111, . . . , T3 and T1 has the threshold voltage level HVT. Correspondingly, each of the memory cells MC1-MC57 has the resistance r.

At this moment, the resistance of the string resistor RSTRING is equal to the resistance R multiplied by 7.11, that is, 7.11R. Correspondingly, the conductance GMS1 is equal to the conductance X multiplied by 9. The current level of the string current signal ISTRING is equal to the current level ISTRL multiplied by 9, and is equal to the voltage level VBL divided by 7.11R.

Figures 3E, 3F:
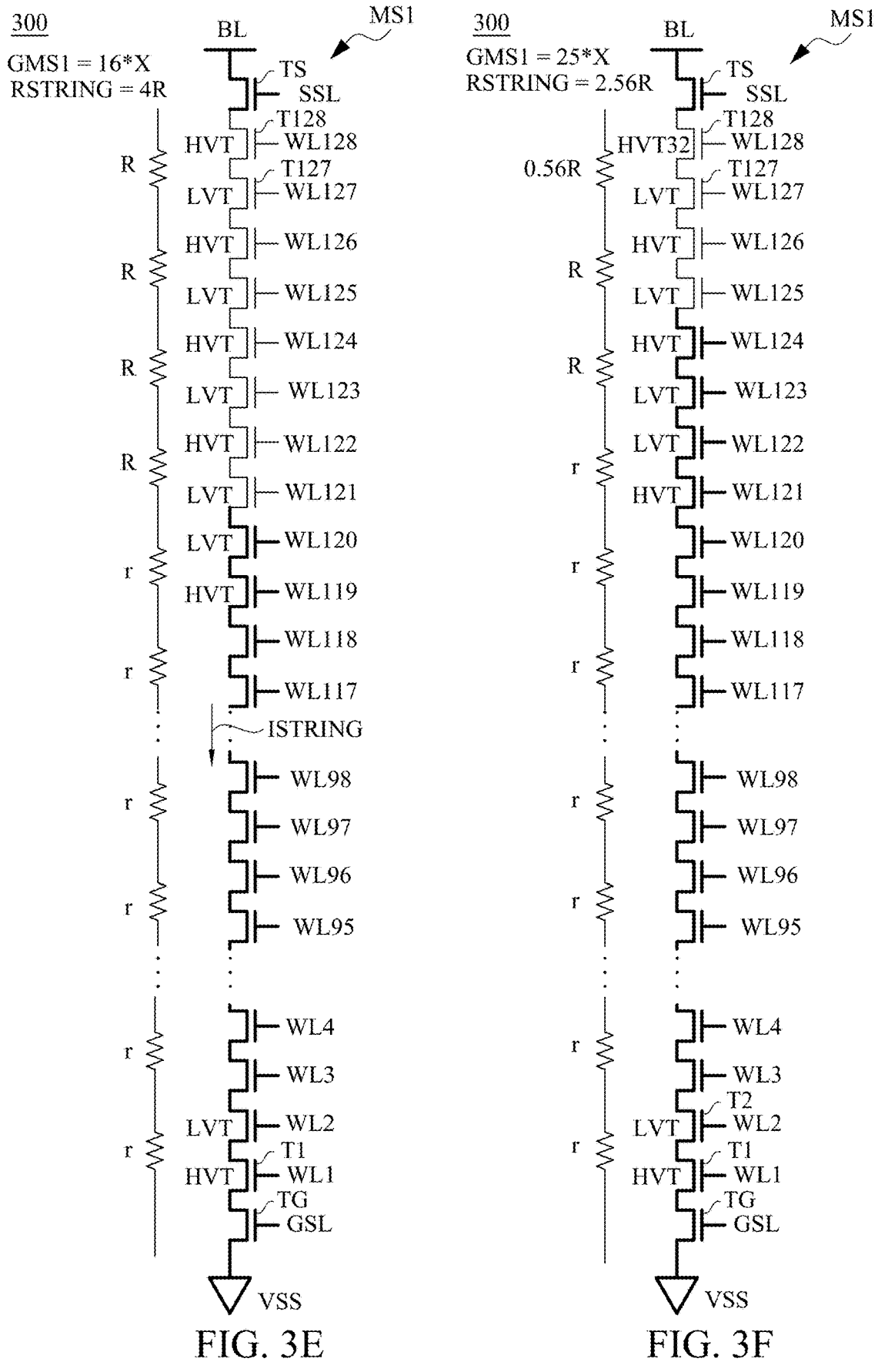

In the embodiments shown in FIG. 3E, each of the switch elements T125, T123, T123 and T121 has the threshold voltage level LVT, and each of switch elements T128, T126, T124 and T122 has the threshold voltage level HVT. Correspondingly, each of the memory cells MC61-MC64 has the resistance R.

On the other hand, each of the switch elements T120, T118, . . . , T4 and T2 has the threshold voltage level LVT, and each of switch elements T119, T117, . . . , T3 and T1 has the threshold voltage level HVT. Correspondingly, each of the memory cells MC1-MC60 has the resistance r.

At this moment, the resistance of the string resistor RSTRING is equal to the resistance R multiplied by 4, that is, 4R. Correspondingly, the conductance GMS1 is equal to the conductance X multiplied by 16. The current level of the string current signal ISTRING is equal to the current level ISTRL multiplied by 16, and is equal to the voltage level VBL divided by 4R.

In the embodiments shown in FIG. 3F, each of the switch elements T125 and T123 has the threshold voltage level LVT, and each of switch elements T126 and T124 has the threshold voltage level HVT. Correspondingly, each of the memory cells MC62 and MC63 has the resistance R. Furthermore, the switch elements T128 and T127 has threshold voltage levels HVT32 and LVT, respectively. In which the threshold voltage level HVT32 is smaller than the threshold voltage levels HVT and larger than the threshold voltage level LVT. Correspondingly, the resistance of the memory cell MC64 is equal to the resistance R multiplied by 0.56, that is, 0.56R.

On the other hand, each of the switch elements T122, T120, . . . , T4 and T2 has the threshold voltage level LVT, and each of switch elements T121, T119, . . . , T3 and T1 has the threshold voltage level HVT. Correspondingly, each of the memory cells MC1-MC61 has the resistance r.

At this moment, the resistance of the string resistor RSTRING is equal to the resistance R multiplied by 2.56, that is, 2.56R. Correspondingly, the conductance GMS1 is equal to the conductance X multiplied by 25. The current level of the string current signal ISTRING is equal to the current level ISTRL multiplied by 25, and is equal to the voltage level VBL divided by 2.56R.

Figures 3G, 3H:
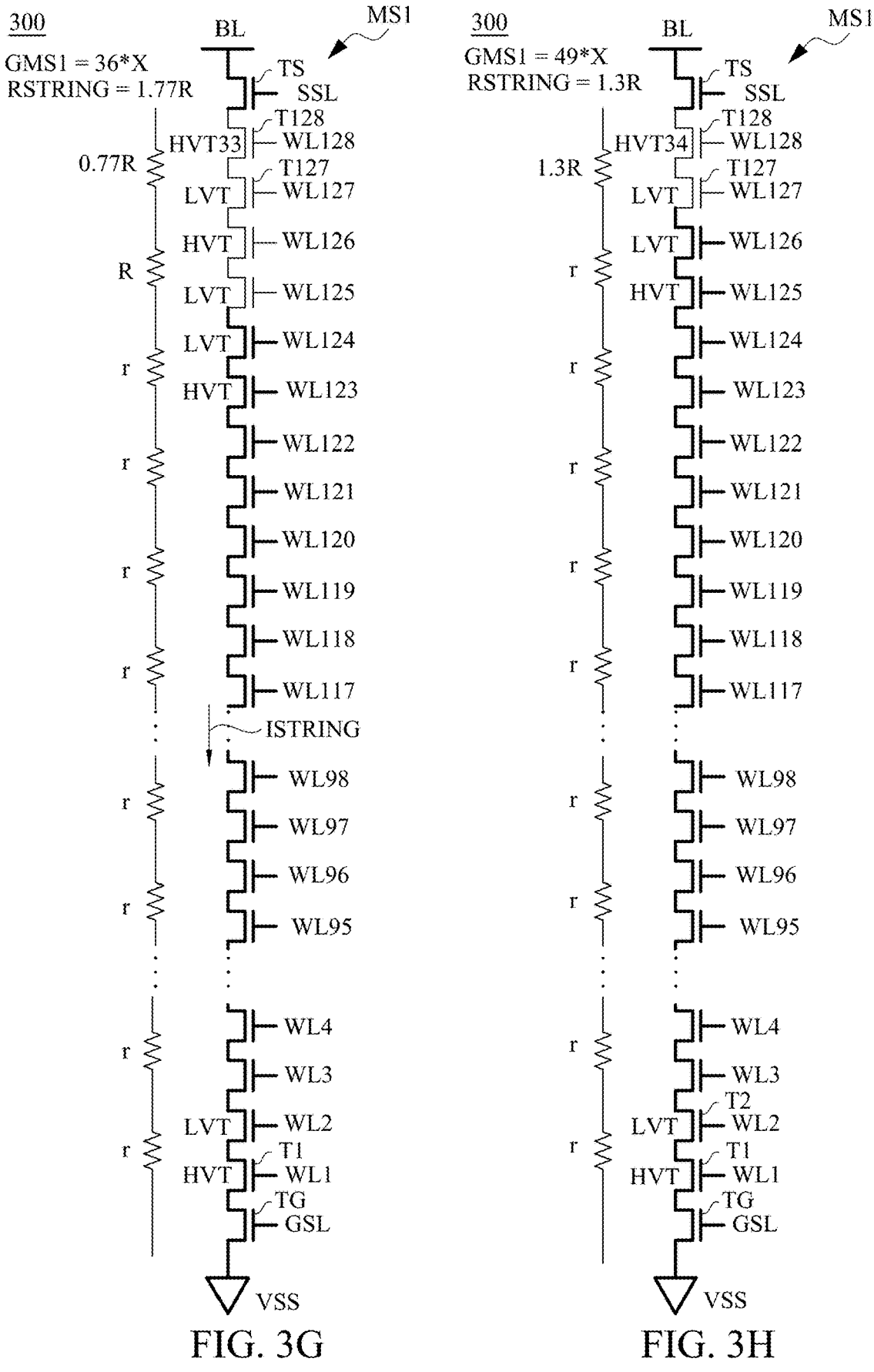

In the embodiments shown in FIG. 3G, the switch elements T125 and T126 have the threshold voltage levels LVT and HVT, respectively, such that the memory cell MC62 has the resistance R. Furthermore, the switch elements T128 and T127 has threshold voltage levels HVT33 and LVT, respectively. In which the threshold voltage level HVT33 is smaller than the threshold voltage levels HVT and larger than the threshold voltage level LVT. Correspondingly, the resistance of the memory cell MC64 is equal to the resistance R multiplied by 0.77, that is, 0.77R.

On the other hand, each of the switch elements T124, T122, . . . , T4 and T2 has the threshold voltage level LVT, and each of switch elements T123, T121, . . . , T3 and T1 has the threshold voltage level HVT. Correspondingly, each of the memory cells MC1-MC62 has the resistance r.

At this moment, the resistance of the string resistor RSTRING is equal to the resistance R multiplied by 1.77, that is, 1.77R. Correspondingly, the conductance GMS1 is equal to the conductance X multiplied by 36. The current level of the string current signal ISTRING is equal to the current level ISTRL multiplied by 36, and is equal to the voltage level VBL divided by 1.77R.

In the embodiments shown in FIG. 3H, the switch elements T128 and T127 has threshold voltage levels HVT34 and LVT, respectively. In which the threshold voltage level HVT34 is larger than the threshold voltage level HVT. Correspondingly, the resistance of the memory cell MC64 is equal to the resistance R multiplied by 1.3, that is, 1.3R.

On the other hand, each of the switch elements T126, T124, . . . , T4 and T2 has the threshold voltage level LVT, and each of switch elements T125, T123, . . . , T3 and T1 has the threshold voltage level HVT. Correspondingly, each of the memory cells MC1-MC63 has the resistance r.

At this moment, the resistance of the string resistor RSTRING is equal to the resistance R multiplied by 1.3, that is, 1.3R. Correspondingly, the conductance GMS1 is equal to the conductance X multiplied by 49. The current level of the string current signal ISTRING is equal to the current level ISTRL multiplied by 49, and is equal to the voltage level VBL divided by 1.3R.

Figure 3I:
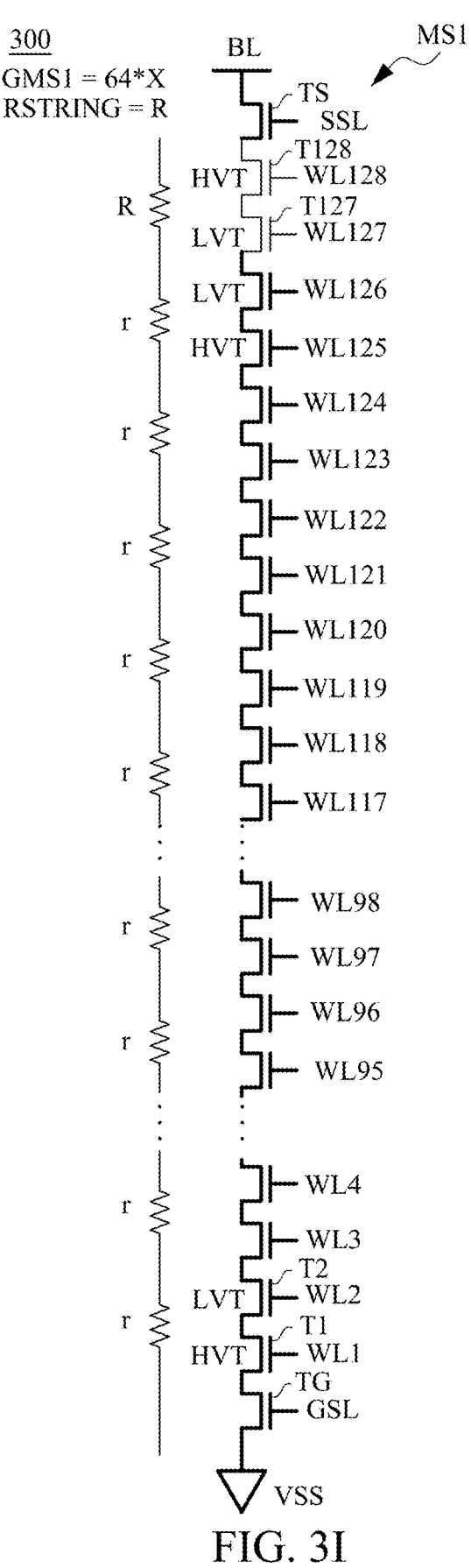

In the embodiments shown in FIG. 3I, the switch elements T128 and T127 has threshold voltage levels HVT and LVT, respectively. Correspondingly, the resistance of the memory cell MC64 has the resistance R.

On the other hand, each of the switch elements T126, T124, . . . , T4 and T2 has the threshold voltage level LVT, and each of switch elements T125, T123, . . . , T3 and T1 has the threshold voltage level HVT. Correspondingly, each of the memory cells MC1-MC63 has the resistance r.

At this moment, the resistance of the string resistor RSTRING has the resistance R. Correspondingly, the conductance GMS1 is equal to the conductance X multiplied by 64. The current level of the string current signal ISTRING is equal to the current level ISTRL multiplied by 64, and is equal to the voltage level VBL divided by the resistance R.

Referring to FIG. 3D, FIG. 3F, FIG. 3G and FIG. 3H, the threshold voltage levels HVT31-HVT34 correspond to the resistances 1.11R, 0.56R, 0.77R and 1.3R, respectively. Correspondingly, the threshold voltage level HVT34 is larger than the threshold voltage level HVT31. The threshold voltage level HVT31 is larger than the threshold voltage level HVT33. The threshold voltage level HVT33 is larger than the threshold voltage level HVT32.

Referring to FIG. 2A to FIG. 3I, in the embodiments shown in FIG. 3A to FIG. 3I, each of the word line signals WL1, WL3, . . . , WL125 and WL127 has the search bias level VH2, and each of the word line signals WL2, WL4, . . . , WL126 and WL128 has the search bias level VH1.

In the embodiments shown in FIG. 3A to FIG. 3I, the current level of the string current signal ISTRING is equal to the current level ISTRL multiplied by $0^2, 1^2, 2^2, 3^2, 4^2, 5^2,$ $6^2$, $7^2$ and $8^2$, respectively. As a result, 9 level Euclidean distance calculation can be performed by the memory device 300.

Compared to the memory device 100, the memory device 300 has higher stack three dimensional NAND (3D-NAND) elements. Correspondingly, the memory device 300 can provide more levels for Euclidean distance computing. Furthermore, the memory cells with the resistance r are close to the ground select line signal GSL, for lowering body effect.

FIG. 3J is a schematic diagram of a memory device performing encoding operation, illustrated according to some embodiments of present disclosure. In various embodiments, the string current signal ISTRING can have different current levels, to compute Euclidean distances of different levels.

As shown in FIG. 3J, for an integer m, when the resistance of the string resistor RSTRING is equal to the resistance R multiplied by n (that is, (n)R), the string current signal ISTRING has the current level ISTRL, that is, the voltage level VBL divided by (n)R.

When the resistance of the string resistor RSTRING is equal to the resistance R multiplied by n and divided by 4 (that is, (n/4)R), the current level of the string current signal ISTRING is equal to the current level ISTRL multiplied by $2^2$, that is, the voltage level VBL divided by (n/4)R.

When the resistance of the string resistor RSTRING is equal to the resistance R multiplied by n and divided by 9 (that is, (n/9)R), the current level of the string current signal ISTRING is equal to the current level ISTRL multiplied by $3^2$, that is, the voltage level VBL divided by (n/9)R.

When the resistance of the string resistor RSTRING is equal to the resistance R multiplied by n and divided by 16 (that is, (n/16)R), the current level of the string current signal ISTRING is equal to the current level ISTRL multiplied by $4^2$, that is, the voltage level VBL divided by (n/16)R.

When the resistance of the string resistor RSTRING is equal to the resistance R multiplied by n and divided by 25 (that is, (n/25)R), the current level of the string current signal ISTRING is equal to the current level ISTRL multiplied by $5^2$, that is, the voltage level VBL divided by (n/25)R.

When the resistance of the string resistor RSTRING is equal to the resistance R multiplied by n and divided by 36 (that is, (n/36)R), the current level of the string current signal ISTRING is equal to the current level ISTRL multiplied by $6^2$, that is, the voltage level VBL divided by (n/36)R.

When the resistance of the string resistor RSTRING is equal to the resistance R multiplied by n and divided by 49 (that is, (n/49)R), the current level of the string current signal ISTRING is equal to the current level ISTRL multiplied by $7^2$, that is, the voltage level VBL divided by (n/49)R.

When the resistance of the string resistor RSTRING is equal to the resistance R multiplied by n and divided by 64 (that is, (n/64)R), the current level of the string current signal ISTRING is equal to the current level ISTRL multiplied by $8^2$, that is, the voltage level VBL divided by (n/64)R.

When the resistance of the string resistor RSTRING is equal to the resistance R multiplied by n and divided by 81 (that is, (n/81)R), the current level of the string current signal ISTRING is equal to the current level ISTRL multiplied by $9^2$, that is, the voltage level VBL divided by (n/81)R.

When the resistance of the string resistor RSTRING is equal to the resistance R multiplied by n and divided by 100 (that is, (n/100)R), the current level of the string current signal ISTRING is equal to the current level ISTRL multiplied by $10^2$, that is, the voltage level VBL divided by (n/100)R, and so on.

When the resistance of the string resistor RSTRING is equal to the resistance R multiplied by n and divided by $m^2$ (that is, $(n/m^2)R$), the current level of the string current signal ISTRING is equal to the current level ISTRL multiplied by $m^2$, that is, the voltage level VBL divided by $(n/m^2)R$. In the embodiments shown in FIG. 1A to FIG. 1H, m is equal to 7 and n is equal to 48. In the embodiments shown in FIG. 3A to FIG. 3I, m is equal to 8 and n is equal to 64.

Figure 4A:
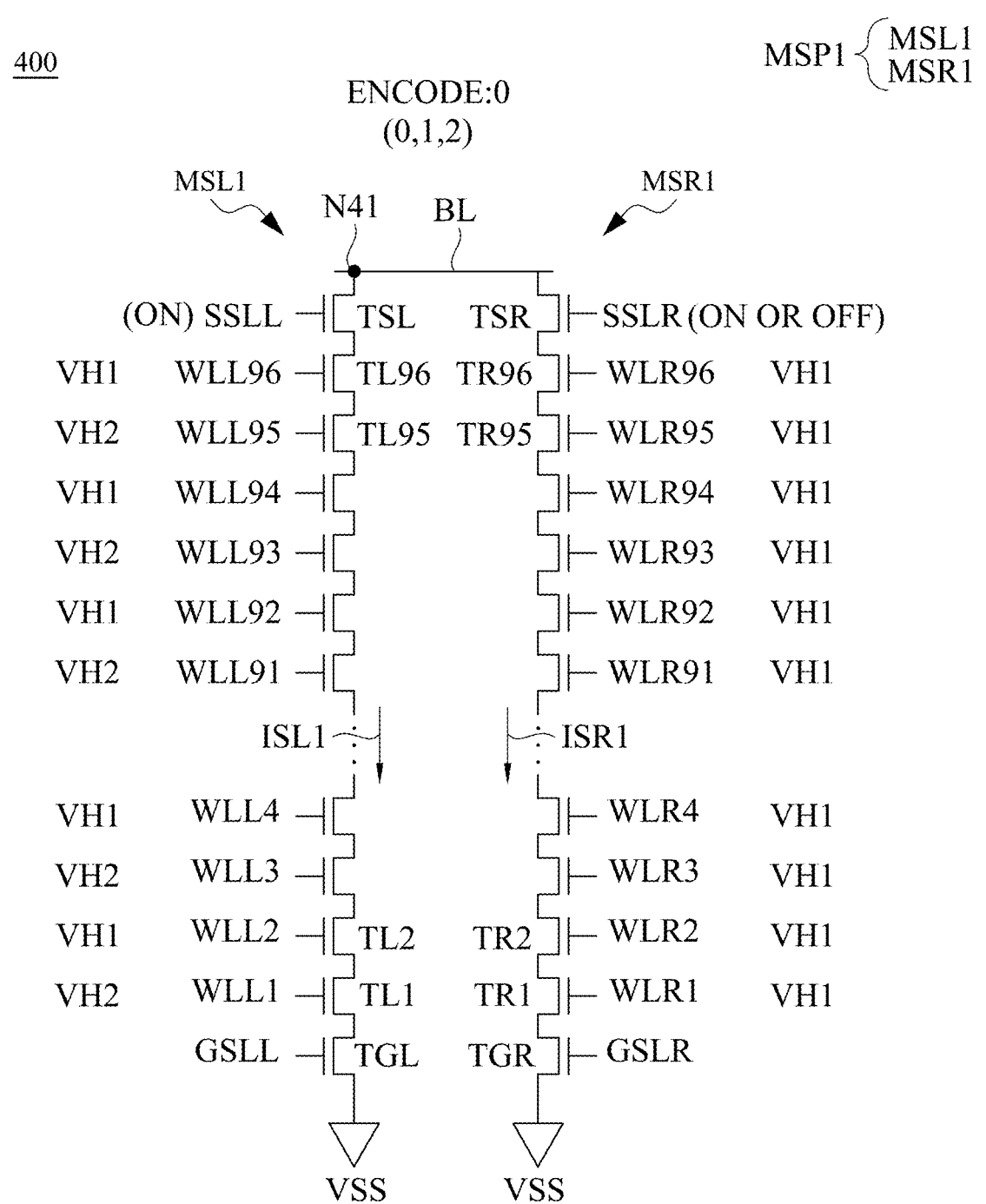
FIG. 4A to FIG. 4C are schematic diagrams of a memory device performing searching operation, illustrated according to some embodiments of present disclosure.
Figure 4B:
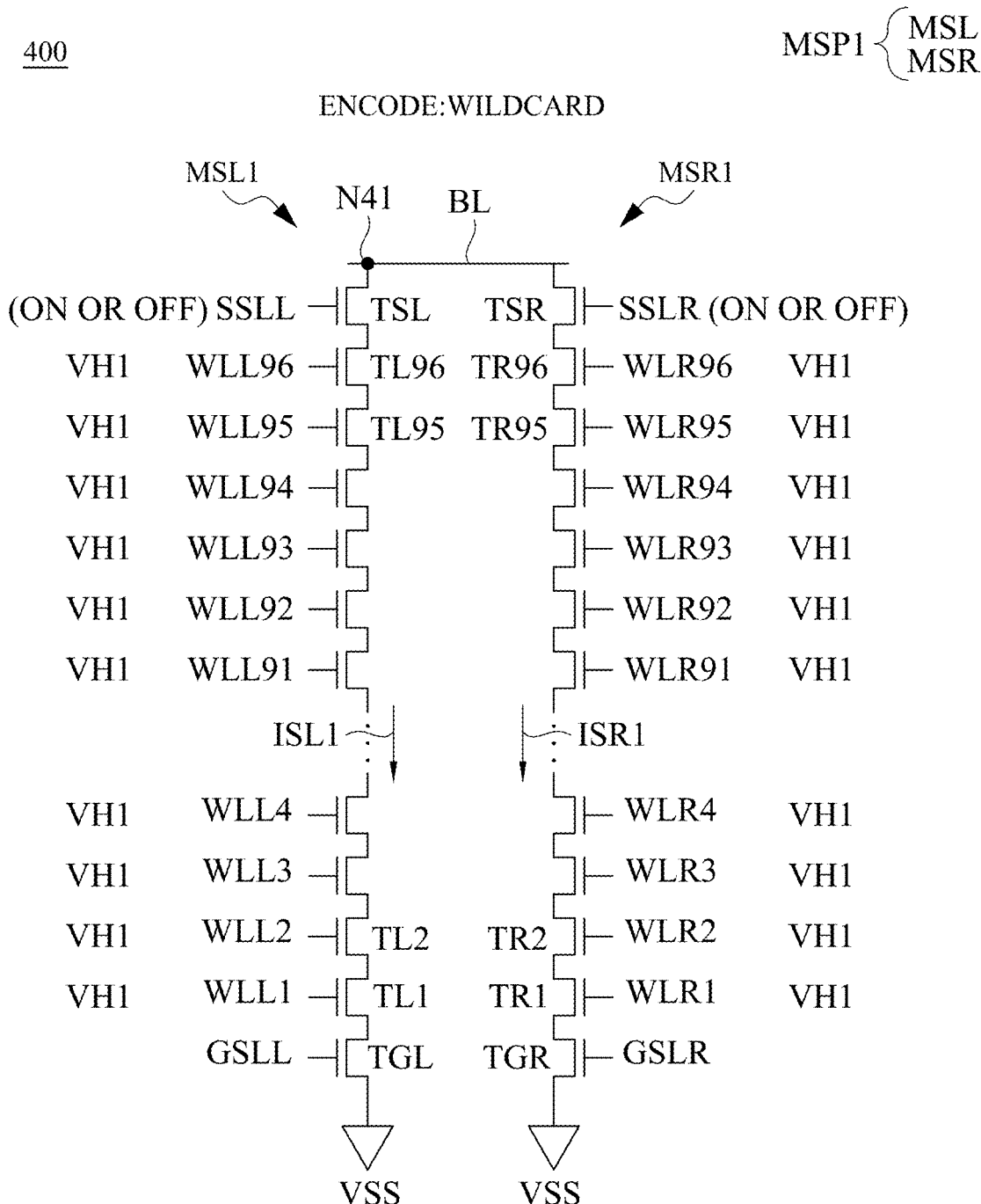
Figure 4C:
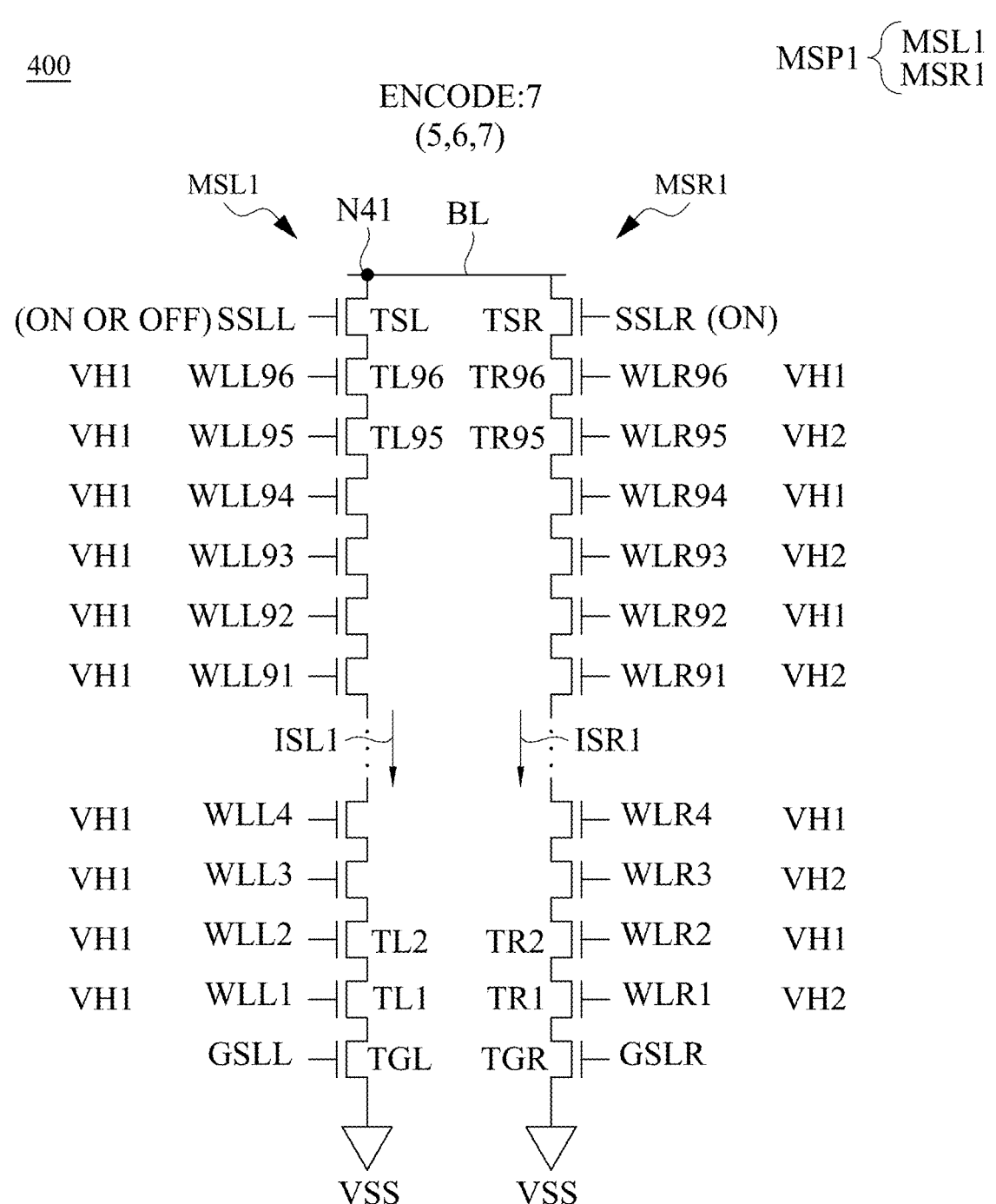

FIG. 4A to FIG. 4C are schematic diagrams of a memory device 400 performing searching operation, illustrated according to some embodiments of present disclosure. As shown in FIG. 4A, the memory device 400 at least include a memory string pair MSP1. The memory string pair MSP1 includes memory strings MSL1 and MSR1. The memory strings MSL1 and MSR1 are coupled to each other at a node N41.

In some embodiments, the memory strings MSL1 and MSR1 are configured to generate string current signals ISL1 and ISR1, respectively, and sum the string current signals ISL1 and ISR1 at the node N41, to generate the bit line signal BL.

As shown in FIG. 4A, the memory string MSL1 incudes switch elements TGL, TL1-TL96 and TSL. Control terminals of the switch elements TGL, TL1-TL96 and TSL are configured to receive the ground select line signal GSLL, the word line signals WLL1-WLL96 and the string select line signal SSLL, respectively.

Similarly, the memory string MSR1 incudes switch elements TGR, TR1-TR96 and TSR. Control terminals of the switch elements TGR, TR1-TR96 and TSR are configured to receive the ground select line signal GSLR, the word line signals WLR1-WLR96 and the string select line signal SSLR, respectively.

Referring to FIG. 1A and FIG. 4A, the memory string MSL1 is an embodiment to the memory string MS1. The switch elements TGL, TL1-TL96 and TSL correspond to the switch elements TG, T1-T96 and TS, respectively. The ground select line signal GSLL, the word line signals WLL1-WLL96 and the string select line signal SSLL correspond to the ground select line signal GSL, the word line signals WL1-WL96 and the string select line signal SSL, respectively. Therefore, for brevity, some descriptions are not repeated.

Similarly, the memory string MSR1 is an embodiment to the memory string MS1. The switch elements TGR, TR1-TR96 and TSR correspond to the switch elements TG, T1-T96 and TS, respectively. The ground select line signal GSLR, the word line signals WLR1-WLR96 and the string select line signal SSLR correspond to the ground select line signal GSL, the word line signals WL1-WL96 and the string select line signal SSL, respectively. Therefore, for brevity, some descriptions are not repeated.

During the searching operation, the word line signals WLL1-WLL96 and WLR1-WLR96 can be configured to carry an input bit SB1. In the embodiment shown in FIG. 4A, the input bit SB1 has a logic value 0, 1 or 2, and has a corresponding encode value 0.

In response to the input bit SB1 has the encode value 0, each of the word line signals WLR1-WLR96 has the search bias level VH1, each of the word line signals WLL1, WLL3, . . . , WLL93 and WLL95 has the search bias level VH2, and each of the word line signals WLL2, WLL4, . . . , WLL94 and WLL96 has the search bias level VH1.

In some embodiments, the string select line signals SSLL and SSLR can have different operations according to the encode value of the input bit SB1. In the embodiment shown in FIG. 4A, in response to the input bit SB1 has the encode value 0, the string select line signals SSLL has a turned on voltage level to turn on the switch element TSL, and the string select line signals SSLR has the turned on voltage level or a turned off voltage level to turn on or turn off the switch element TSR.

In the embodiment shown in FIG. 4B, the input bit SB1 has a logic value 3 or 4, and has a wildcard encode value. In some embodiments, wildcard encode value is referred to as an arbitrary encode value during input. In response to the input bit SB1 has the wildcard encode value, each of the word line signals WLR1-WLR96 and WLL1-WLL96 has the search bias level VH1.

On the other hand, in response to the input bit SB1 has the wildcard encode value, the string select line signals SSLL has the turned on voltage level or the turned off voltage level to turn on or turn off the switch element TSR, and the string select line signals SSLR has the turned on voltage level or the turned off voltage level to turn on or turn off the switch element TSR.

In the embodiment shown in FIG. 4C, the input bit SB1 has a logic value 5, 6 or 7, and has a corresponding encode value 7. In response to the input bit SB1 has the encode value 7, each of the word line signals WLL1-WLL96 has the search bias level VH1, each of the word line signals WLR1, WLR3, . . . , WLR93 and WLR95 has the search bias level VH2, and each of the word line signals WLR2, WLR4, . . . , WLR94 and WLR96 has the search bias level VH1.

On the other hand, in response to the input bit SB1 has the encode value 7, the string select line signals SSLL has the turned on voltage level or the turned off voltage level to turn on or turn off the switch element TSR, and the string select line signals SSLR has the turned on voltage level to turn on the switch element TSR.

FIG. 5A to FIG. 5H are schematic diagrams of the memory device 400 storing the store bit of different logic values, illustrated according to some embodiments of present disclosure. For brevity, some labels are not shown in FIG. 5A to FIG. 5H, such as the labels of the switch elements TGL, TL1-TL96, TSL, TGR, TR1-TR96 and TSR.

In some embodiments, the memory string pair MSP1 is configured to store a store bit DT1. The store bit DT1 can have various logic values. Referring to FIG. 1A to FIG. 1H and FIG. 5A, in response to the logic value of the store bit DT1, each of the memory strings MSL1 and MSR1 has the configuration of the threshold voltage levels of the memory string MS1 shown in a corresponding one of FIG. 1A to FIG. 1H.

In the embodiment shown in FIG. 5A, the store bit DT1 has the logic value 0. Correspondingly, the memory string MSL1 has the configuration shown in FIG. 1A, and the memory string MSR1 has the configuration shown in FIG. 1H. Alternatively stated, a conductance GL1 of the memory string MSL1 is equal to the conductance X multiplied by zero, and a string resistor RSL of the memory string MSL1 has the resistance 47R+R". A conductance GR1 of the memory string MSR1 is equal to the conductance X multiplied by 49, and a string resistor RSR of the memory string MSR1 has the resistance 0.97R.

In the embodiment shown in FIG. 5B, the store bit DT1 has the logic value 1. Correspondingly, the memory string MSL1 has the configuration shown in FIG. 1B, and the memory string MSR1 has the configuration shown in FIG. 1G. Alternatively stated, the conductance GL1 is equal to the conductance X multiplied by 1, and the string resistor RSL has the resistance 48R. The conductance GR1 is equal to the conductance X multiplied by 36, and the string resistor RSR has the resistance 1.33R.

In the embodiment shown in FIG. 5C, the store bit DT1 has the logic value 2. Correspondingly, the memory string MSL1 has the configuration shown in FIG. 1C, and the memory string MSR1 has the configuration shown in FIG. 1F. Alternatively stated, the conductance GL1 is equal to the conductance X multiplied by 4, and the string resistor RSL has the resistance 12R. The conductance GR1 is equal to the conductance X multiplied by 25, and the string resistor RSR has the resistance 1.92R.

In the embodiment shown in FIG. 5D, the store bit DT1 has the logic value 3. Correspondingly, the memory string MSL1 has the configuration shown in FIG. 1D, and the memory string MSR1 has the configuration shown in FIG. 1E. Alternatively stated, the conductance GL1 is equal to the conductance X multiplied by 9, and the string resistor RSL has the resistance 5.33R. The conductance GR1 is equal to the conductance X multiplied by 16, and the string resistor RSR has the resistance 3R.

Figure 5E:
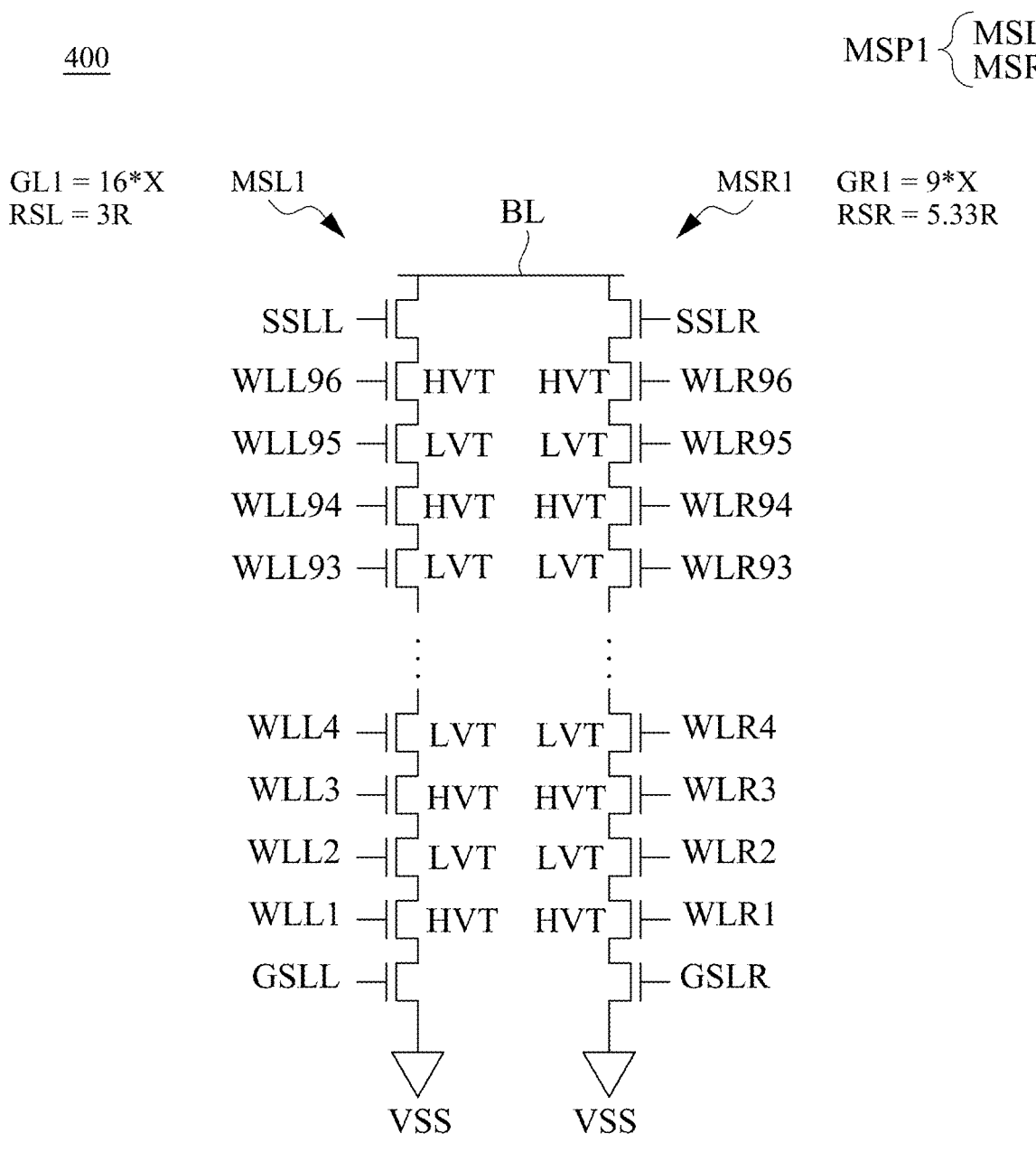

In the embodiment shown in FIG. 5E, the store bit DT1 has the logic value 4. Correspondingly, the memory string MSL1 has the configuration shown in FIG. 1E, and the memory string MSR1 has the configuration shown in FIG. 1D. Alternatively stated, the conductance GL1 is equal to the conductance X multiplied by 16, and the string resistor RSL has the resistance 3R. The conductance GR1 is equal to the conductance X multiplied by 9, and the string resistor RSR has the resistance 5.33R.

Figure 5F:
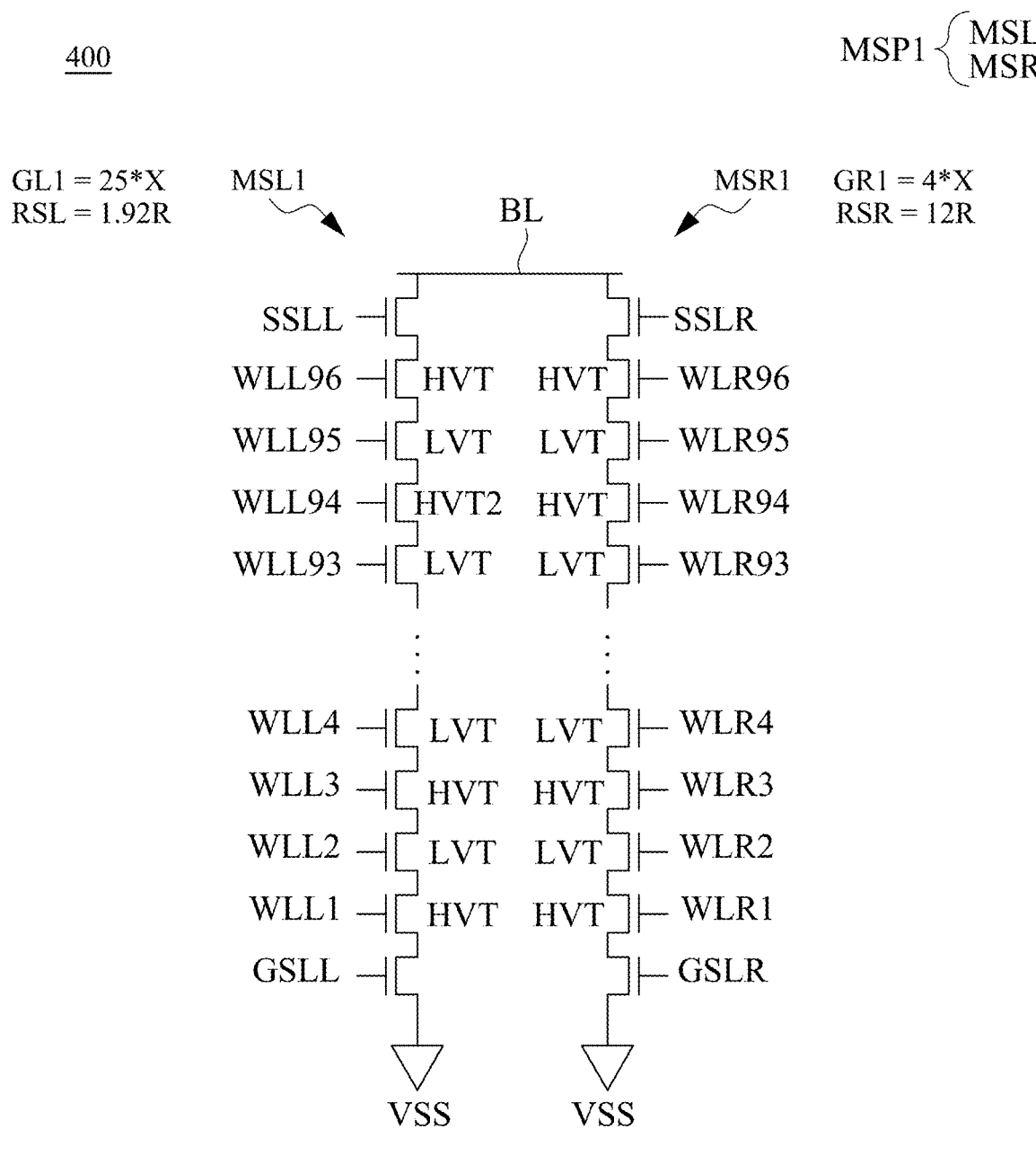

In the embodiment shown in FIG. 5F, the store bit DT1 has the logic value 5. Correspondingly, the memory string MSL1 has the configuration shown in FIG. 1F, and the memory string MSR1 has the configuration shown in FIG. 1C. Alternatively stated, the conductance GL1 is equal to the conductance X multiplied by 25, and the string resistor RSL has the resistance 1.92R. The conductance GR1 is equal to the conductance X multiplied by 4, and the string resistor RSR has the resistance 12R.

Figure 5G:
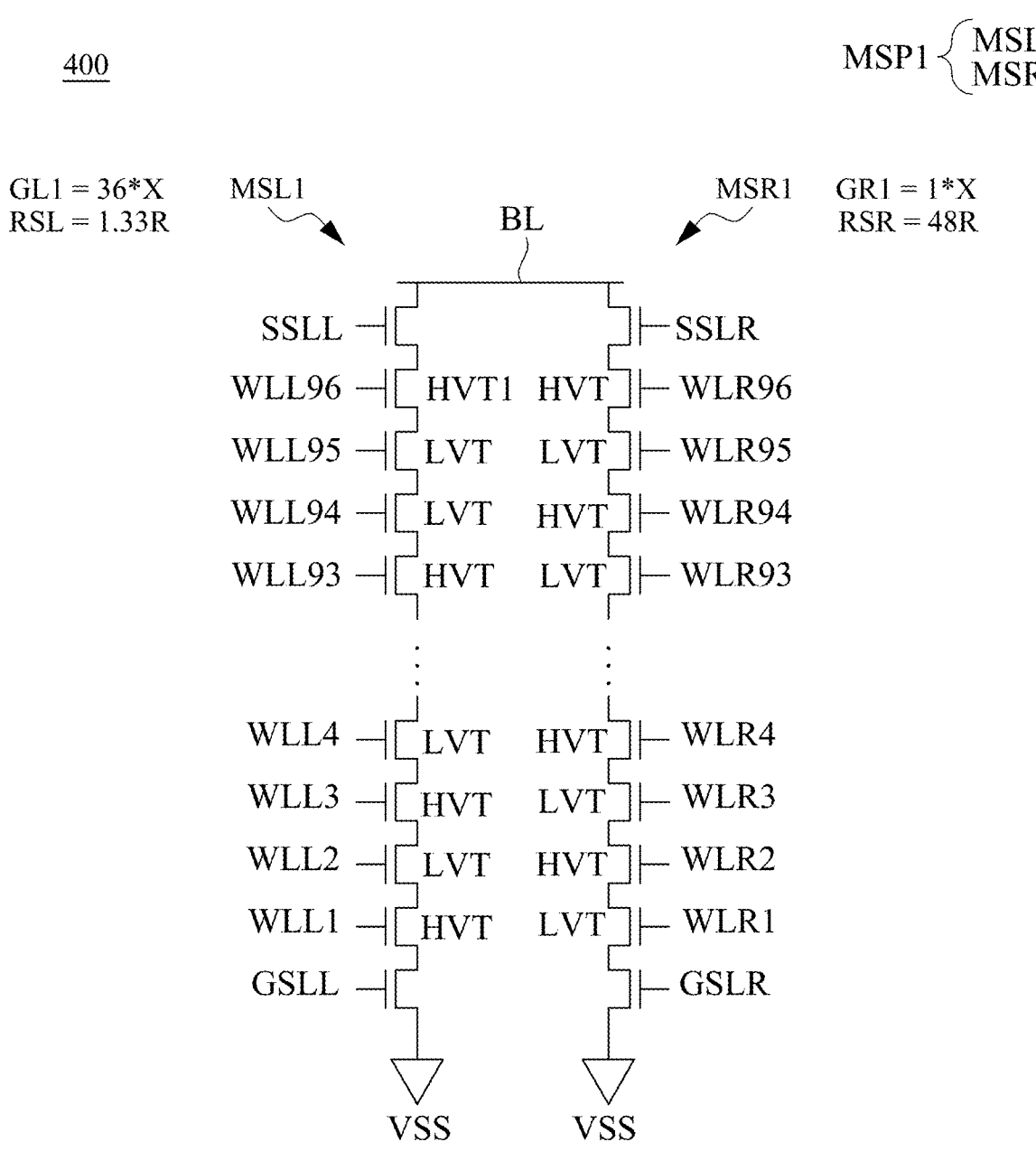

In the embodiment shown in FIG. 5G, the store bit DT1 has the logic value 6. Correspondingly, the memory string MSL1 has the configuration shown in FIG. 1G, and the memory string MSR1 has the configuration shown in FIG. 1B. Alternatively stated, the conductance GL1 is equal to the conductance X multiplied by 36, and the string resistor RSL has the resistance 1.33R. The conductance GR1 is equal to the conductance X multiplied by 1, and the string resistor RSR has the resistance 48R.

In the embodiment shown in FIG. 5H, the store bit DT1 has the logic value 7. Correspondingly, the memory string MSL1 has the configuration shown in FIG. 1H, and the memory string MSR1 has the configuration shown in FIG. 1A. Alternatively stated, the conductance GL1 is equal to the conductance X multiplied by 49, and the string resistor RSL has the resistance 0.97R. The conductance GR1 is equal to the conductance X multiplied by zero, and the string resistor RSR has the resistance 47R+R".

In the embodiments shown in FIG. 5A to FIG. 5H, the conductance GL1 is proportional to a square of the logic values 0-7, and the conductance GR1 is proportional to a square of the logic values 7-0. In response to two different logic values of the store bit DT1, the conductances GL1 and GR1 correspond to a square of a difference between the two logic values.

For example, in response to the store bit DT1 having the logic value 0, the conductance GR1 is proportional to a square 49 of the difference 7 between the logic values 0 and 7. In response to the store bit DT1 having the logic value 7, the conductance GL1 is proportional to a square 49 of the difference 7 between the logic values 0 and 7. In response to the store bit DT1 having the logic value 1, the conductance GL1 is proportional to a square 1 of the difference 1 between the logic values 0 and 1, and the conductance GR1 is proportional to a square 36 of the difference 6 between the logic values 1 and 7.

Similarly, in response to the store bit DT1 having the logic value 2, the conductance GL1 is proportional to a square 4 of the difference 2 between the logic values 0 and 2, and the conductance GR1 is proportional to a square 25 of the difference 5 between the logic values 2 and 7.

FIG. 6A is a schematic diagram of various encoding conditions of the memory device 400, illustrated according to some embodiments of present disclosure. Referring to FIG. 4A and FIG. 6A, in some embodiments, the memory strings MSL1 and MSR1 can be referred to as a left string and a right string.

As shown in FIG. 6A, when the input bit SB1 has the logic value 0, 1 or 2, the input bit SB1 has the encode value 0. Correspondingly, the word line signals WLL1-WLL96 have the search bias levels VH1 and VH2 arranged alternately. The string select line signal SSLL has the turned on voltage level. At this moment, the memory string MSL1 can perform the operations of the memory string MS1 shown in FIG. 1A to FIG. 1H, such that the string current signal ISL1 has the current level corresponding to the logic value of the store bit DT1. Alternatively stated, the current level of the string current signal ISL1 is proportional to a square of a difference between the logic value of the input bit SB1 and the logic value of the store bit DT1.

On the other hand, in response to the input bit SB1 has the encode value 0, each of the word line signals WLR1-WLR96 has the search bias level VH1, such that at least one switch element in the memory string MSR1 is turned off. The string select line signal SSLR can have the turned off voltage level. At this moment, the string current signal ISR1 has a zero current level.

When the input bit SB1 has the logic value 3 or 4, the input bit SB1 has the wildcard encode value. Correspondingly, each of the word line signals WLL1-WLL96 and WLR1-WLR96 has the search bias level VH1, such that at least one switch element in each of the memory strings MSR1 and MSL1 is turned off. Each of the string select line signals SSLL and SSLR can have the turned off voltage level. At this moment, each of the string current signals ISL1 and ISR1 has the zero current level.

When the input bit SB1 has the logic value 5, 6 or 7, the input bit SB1 has the encode value 7. Correspondingly, the word line signals WLR1-WLR96 have the search bias levels VH1 and VH2 arranged alternately. The string select line signal SSLR has the turned on voltage level. At this moment, the memory string MSR1 can perform the operations of the memory string MS1 shown in FIG. 1A to FIG. 1H, such that the string current signal ISR1 has the current level corresponding to the logic value of the store bit DT1. Alternatively stated, the current level of the string current signal ISR1 is proportional to a square of a difference between the logic value of the input bit SB1 and the logic value of the store bit DT1.

On the other hand, in response to the input bit SB1 has the encode value 7, each of the word line signals WLL1-WLL96 has the search bias level VH1, such that at least one switch element in the memory string MSL1 is turned off. The string select line signal SSLL can have the turned off voltage level. At this moment, the string current signal ISL1 has the zero current level.

In summary, the logic values 0, 1 and 2 are grouped as the encode value 0. The logic values 5, 6 and 7 are grouped as the encode value 7. The logic values 3 and 4 are grouped as the wildcard encode value, correspond to the string current signals having the zero current level, and do not perform the computation of Euclidean distance.

Figure 6B:
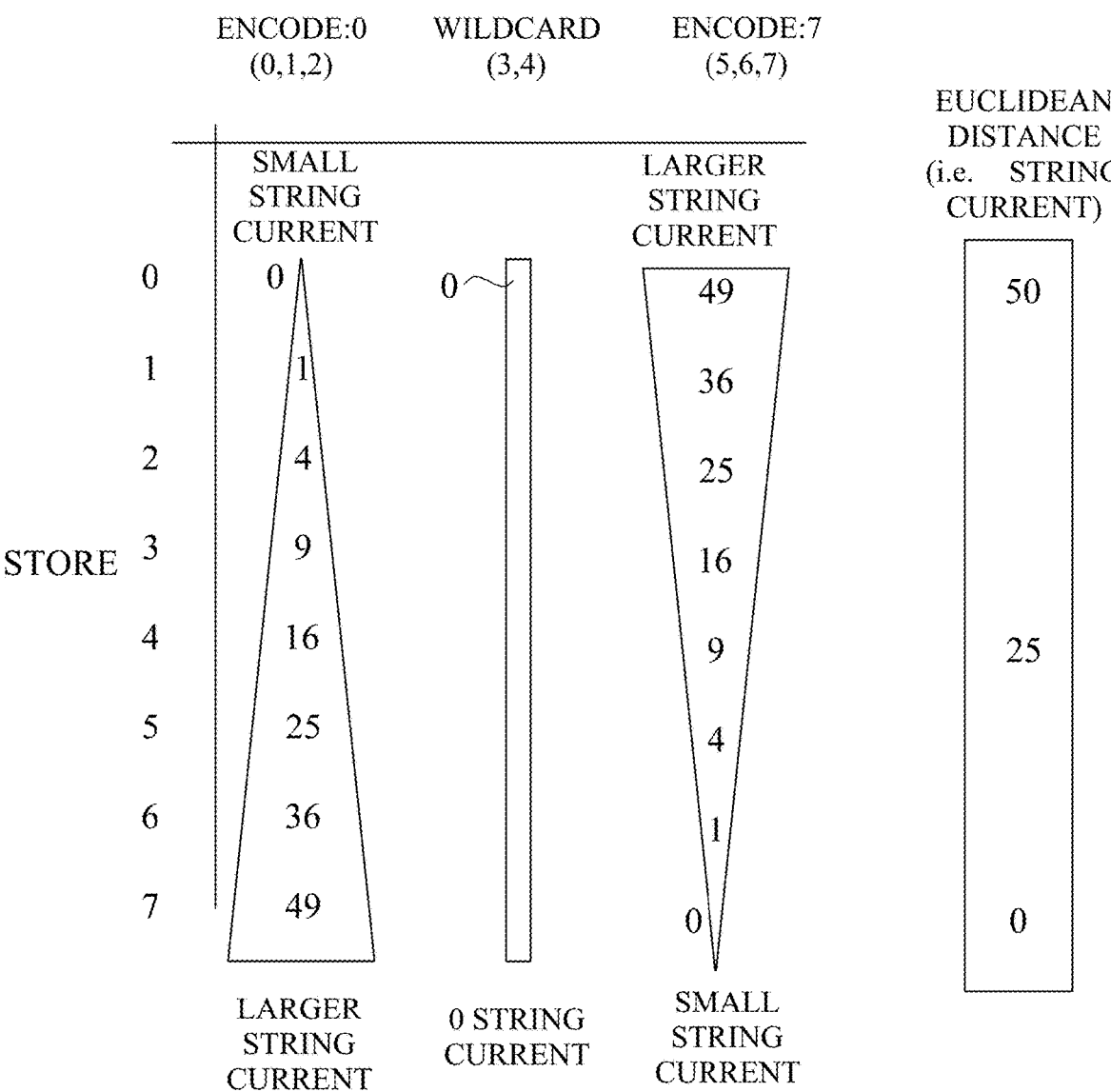
FIG. 6B is a schematic diagram of the memory device computing various Euclidean distances, illustrated according to some embodiments of present disclosure.

FIG. 6B is a schematic diagram of the memory device 400 computing various Euclidean distances, illustrated according to some embodiments of present disclosure. In some embodiments, the memory string pair MSP1 is configured to generate a string current signal IST1. The string current signal IST1 is a summation of the string current signals ISL1 and ISR1. In some embodiments, the memory device 400 can compute the Euclidean distance according to the string current signal IST1.

As shown in FIG. 6B, when the input bit SB1 has the encode value 0, in response to the conditions of the store bit DT1 having the logic values 0-7, the string current signal IST1 has the current levels proportional to 0, 1, 4, 9, 16, 25, 36 and 49, respectively. When the input bit SB1 has the wildcard encode value, the string current signal IST1 has the zero current level. When input bit SB1 has the encode value 7, in response to the conditions of the store bit DT1 having the logic values 0-7, the string current signal IST1 has the current levels proportional to 49, 36, 25, 16, 9, 4, 1 and 0, respectively.

In some embodiments, the Euclidean distance D (x, y) between data point x and y can be represented as following equation (1).

$$D(x, y) = \sqrt{(x_1 - y_1)^2 + \dots + (x_k - y_k)^2}. \qquad \text{equation (1)}$$

In the equation (1), k is a positive integer, the data point x can be represented as k data values $(x_1, \dots, x_k)$ of k dimensions, and the data point y can be represented as k data values $(y_1, \dots, y_k)$ of k dimensions.

In some embodiments, the store bit DT1 can correspond to a data value of the data point x, such as the data value $x_1$. The input bit SB1 can correspond to a data value of the data point y, such as the data value $y_1$. At this moment, the current level of the string current signal IST1 is approximately proportional to $(x_1 - y_1)^2$. As a result, the memory device 400 can generate the bit line signal BL having a current level proportional to a square of the Euclidean distance D (x, y) by k memory string pairs.

FIG. 6C is a comparison diagram of pseudo-Euclidean distance computation of the memory device 400 and ideal Euclidean distance computation, illustrated according to some embodiments of present disclosure. FIG. 6C includes tables 601 and 602. The table 601 corresponds to the ideal Euclidean distance computation. The table 602 corresponds to the pseudo-Euclidean distance computation of the memory device 400 in the present disclosure.

As shown in FIG. 6C, the distribution of the table 601 is similar with the distribution of the table 602. For example, the table 601 includes lines L61-L63. The table 602 includes lines L64-L66. The lines L61-L63 correspond to the lines L64-L66, respectively. The current levels of the lines L62 and L65 are smaller, and the current levels of the lines L61, L63, L64 and L66 are larger.

In some approaches, a memory device only uses two switch elements to store one store bit, such that the reliability and the robustness are lower, and the operation of the word line signals are complicated.

Compared to above approaches, in the embodiments of present disclosure, the memory device 400 store one store bit DT1 by two memory strings MSL1 and MSR1, such that the reliability and the robustness are higher, and the operation of the word line signals WLL1-WLL96 and WLR1-WLR96 are simple.

Figure 7A:
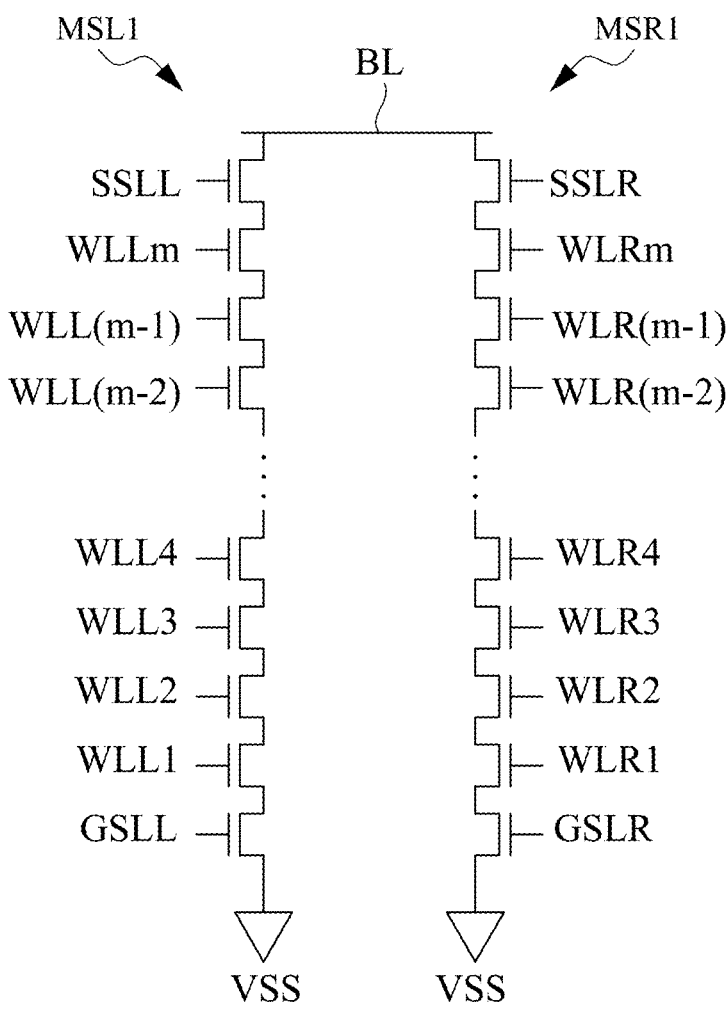
FIG. 7A is a schematic diagram of a memory device, illustrated according to some embodiments of present disclosure.

FIG. 7A is a schematic diagram of a memory device 700, illustrated according to some embodiments of present disclosure. Referring to FIG. 7A and 4A, the memory device 700 is an alternative embodiment of the memory device 400. FIG. 7A follows a similar labeling convention to that of FIG. 4A. For brevity, the discussion will focus more on differences between FIG. 7A and FIG. 4A than on similarities.

As shown in FIG. 7A, the memory device 700 includes the memory string pair MSP1. The memory string pair MSP1 includes the memory strings MSL1 and MSR1. The memory string MSL1 is configured to receive word line signals WLL1-WLLm. The memory string MSR1 is configured to receive word line signals WLR1-WLRm. In which m is a positive integer.

Figure 7B:
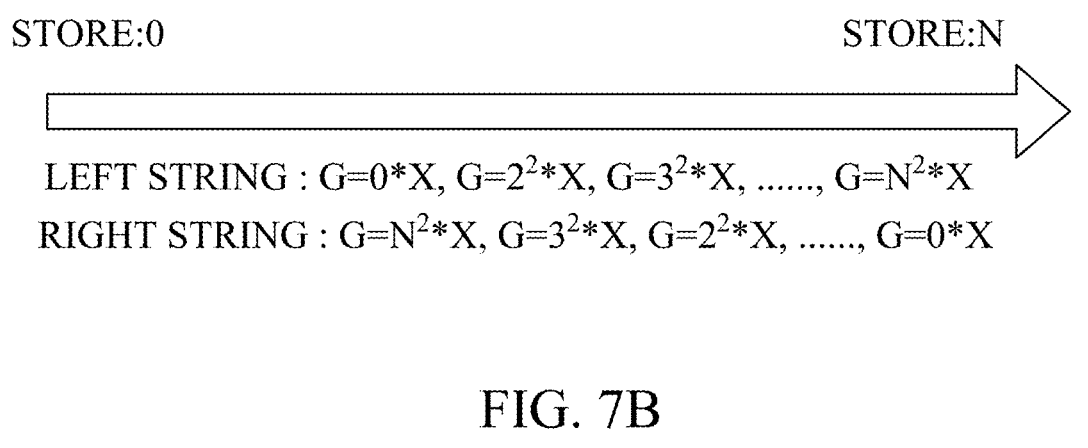

FIG. 7B is a schematic diagram of the store bit DT1 of the memory device 700 having N levels of logic values, illustrated according to some embodiments of present disclosure. As shown in FIG. 7B, in response to the store bit DT1 having the logic value 0 to the logic value N, the conductance G of the left string (that is, the memory string MSL1) is proportional to $0^2, 1^2, 2^2, 3^2, \ldots, N^2$, and the conductance G of the right string (that is, the memory string MSR1) is proportional to $N^2, \ldots, 3^2, 2^2, 1^2, 0^2$.

FIG. 7C is a schematic diagram of various encoding conditions of the memory device 700, illustrated according to some embodiments of present disclosure. As shown in FIG. 7C, when the input bit SB1 has the logic value 0, 1, 2 or 3, the input bit SB1 has the encode value 0. Correspondingly, the word line signals WLL1-WLLm have the search bias levels VH1 and VH2 arranged alternately. The string select line signal SSLL has the turned on voltage level.

On the other hand, in response to the input bit SB1 has the encode value 0, each of the word line signals WLR1-WLR96 has the search bias level VH1, such that at least one switch element in the memory string MSR1 is turned off. The string select line signal SSLR can have the turned off voltage level.

When the input bit SB1 has one of the logic values 4 to (N−4), the input bit SB1 has the wildcard encode value. Correspondingly, each of the word line signals WLL1-WLLm and WLR1-WLRm has the search bias level VH1, such that at least one switch element in each of the memory strings MSR1 and MSL1 is turned off. Each of the string select line signals SSLL and SSLR can have the turned off voltage level.

When the input bit SB1 has the logic value (N−3), (N−2), (N−1) or N, the input bit SB1 has the encode value N. Correspondingly, the word line signals WLR1-WLRm have the search bias levels VH1 and VH2 arranged alternately. The string select line signal SSLR has the turned on voltage level.

On the other hand, in response to the input bit SB1 has the encode value N, each of the word line signals WLL1-WLL96 has the search bias level VH1, such that at least one switch element in the memory string MSL1 is turned off. The string select line signal SSLL can have the turned off voltage level.

Figure 8:
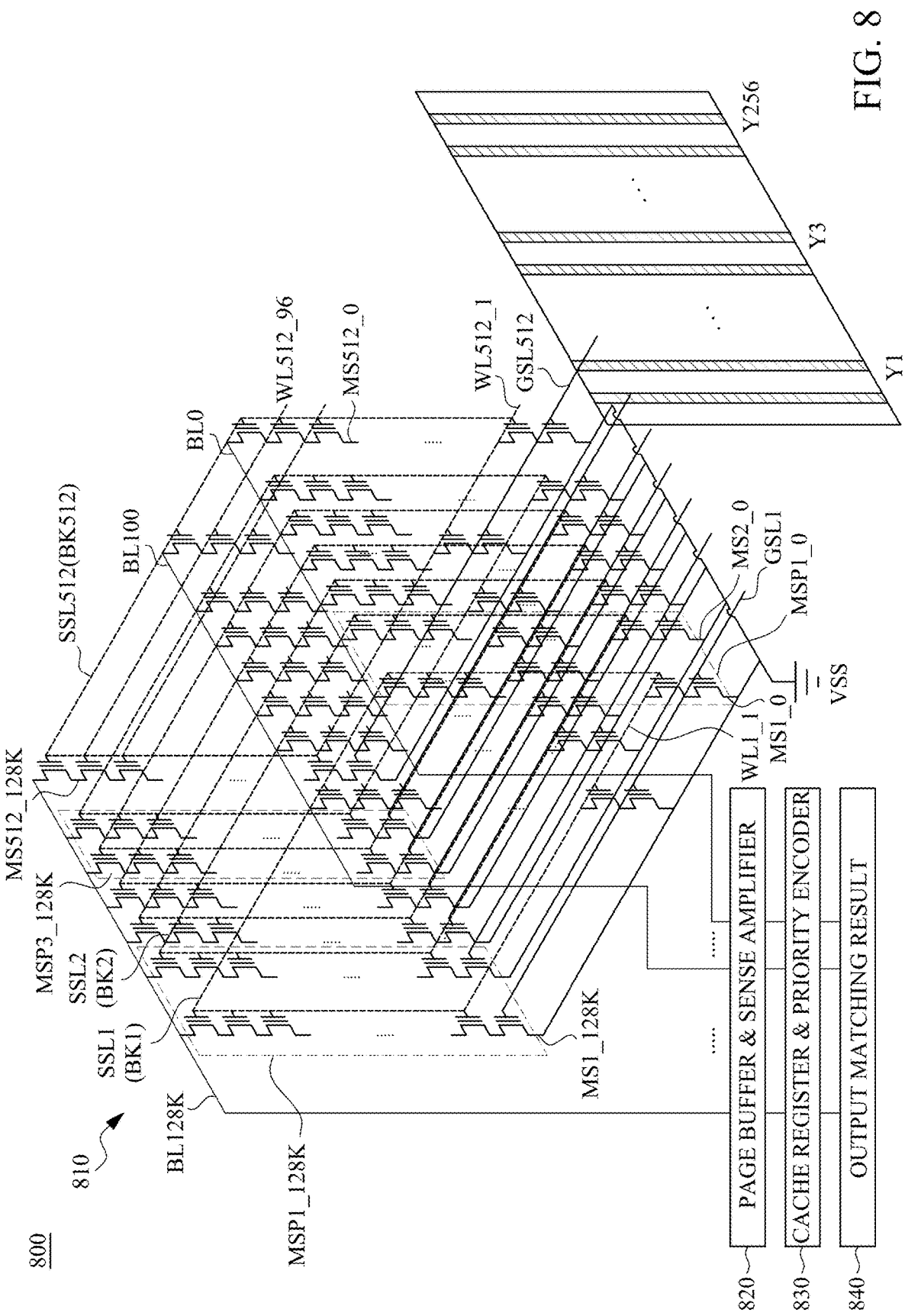
FIG. 8 is a schematic diagram of a memory system illustrated according to some embodiments of present disclosure.

FIG. 8 is a schematic diagram of a memory system 800 illustrated according to some embodiments of present disclosure. As shown in FIG. 8, the memory system 800 includes a memory device 810, a sensing device 820, a register encoding device 830 and an output device 840. In various embodiments, the memory device 810 can be implemented by three-dimensional NAND memory array.

In some embodiments, the memory device 810 is configured to generate bit line signals BL0-BL128K, in which K in 128K represents one thousand. However, the present disclosure is not limited to this. In various embodiments, the memory device 810 can generate various quantities of bit line signals, that is, 128K can be substituted by other positive integers. The sensing device 820 can include a page buffer and a sensing amplifier, and configured to sense corresponding searching results of the bit line signals BL0-BL128K. The register encoding device 830 can includes cache registers and priority encoders. The output device 840 is configured to output the matching results of the memory device 810.

In some embodiments, the process performed by the register encoding device 830 to the bit line signals includes logic processes of AND logic, OR logic or counting, and also may include combining processes of the three logic processes described above. Referring to FIG. 1A to FIG. 8, the register encoding device 830 can receive sense results from the memory device 100, 700 and/or 810, and controls sequencing (whether serial or parallel) and combines sense results to produce overall search results as the matching results outputted from the output device 840.

In some embodiments, the register encoding device 830 is further configured to perform priority encoding to the corresponding searching results of the bit line signals BL0-BL128K. For example, the register encoding device 830 collectively processes the corresponding searching results of the bit line signals BL0-BL128K, and preferentially select an address of a bit line signal corresponding to the best searching result (that is, logic values of the input bits and logic values of the store bits are closest to each other).

As shown in FIG. 8, the memory device 810 includes multiple memory blocks BK1-BK512. However, the present disclosure is not limited to this. In various embodiments, the memory device 810 can include various quantities of memory blocks, that is, 512 can be substituted by other positive integers.

In some embodiments, the memory block BK1 is configured to receive a string select line signal SSL1, word line signals WL1_1-WL1_96 and a ground select line signal GSL1. The memory block BK2 is configured to receive a string select line signal SSL2, word line signals WL2_1-WL2_96 and a ground select line signal GSL2, and so on. The memory block BK512 is configured to receive a string select line signal SSL512, word line signals WL512_1-WL512_96 and a ground select line signal GSL512.

As shown in FIG. 8, the memory block BK1 includes memory strings MS1_0-MS1_128K. The memory block BK2 includes memory strings MS2_0-MS2_128K, and so on. The memory block BK512 includes memory strings MS512_0-MS512_128K.

In some embodiments, two adjacent memory strings configured to generate a same bit line signal can perform the operation of the memory string pair MSP1 shown in FIG. 4A. For example, the memory strings MS1_0 and MS2_0 can operate as a memory string pair MSP1_0. The memory strings MS3_0 and MS4_0 can operate as a memory string pair MSP2_0, and so on. The memory strings MS511_0 and MS512_0 can operate as a memory string pair MSP256_0.

Similarly, the memory strings MS1_100 and MS2_100 can operate as a memory string pair MSP1_100. The memory strings MS3_100 and MS4_100 can operate as a memory string pair MSP2_100, and so on. The memory strings MS511_100 and MS512_100 can operate as a memory string pair MSP256_100.

Similarly, the memory strings MS1_128K and MS2_128K can operate as a memory string pair MSP1_128K. The memory strings MS3_128K and MS4_128K can operate as a memory string pair MSP2_128K, and so on. The memory strings MS511_128K and MS512_128K can operate as a memory string pair MSP256_128K.

In some embodiments, the memory string pairs MSP1_0-MSP256_0 are configured to store store bits X1_0-X256_0, respectively. The memory string pairs MSP1_1-MSP256_1 are configured to store store bits X1_1-X256_1, respectively, and so on. The memory string pairs MSP1_100-MSP256_100 are configured to store store bits X1_100-X256_100, respectively. The memory string pairs MSP1_128K-MSP256_128K are configured to store store bits X1_128K-X256_128K, respectively.

On the other hand, the word line signals WL1_1-WL1_96 and WL2_1-WL2_96 are configured to carry an input bit Y1. The word line signals WL3_1-WL3_96 and WL4_1-WL4_96 are configured to carry an input bit Y2, and so on. The word line signals WL511_1-WL511_96 and WL512_1-WL512_96 are configured to carry an input bit Y256.

During the search operation, the memory string pairs MSP1_0-MSP256_0 are configured to compare the store bits X1_0-X256_0 and the input bits Y1-Y256 to generate the bit line signal BL0. At this moment, a current level of the bit line signal BL0 is proportional to a square of the Euclidean distance between a data point of the store bits X1_0-X256_0 and a data point of the input bits Y1-Y256.

Referring to FIG. 4A and FIG. 8, each of the memory string pairs MSP1_0-MSP256_0 is an embodiment of the memory string pair MSP1. The bit line signal BL0 corresponds to the bit line signal BL. Therefore, some descriptions are not repeated for brevity.

Similarly, during the search operation, the memory string pairs MSP1_100-MSP256_100 are configured to compare the store bits X1_100-X256_100 and the input bits Y1-Y256 to generate the bit line signal BL100. At this moment, a current level of the bit line signal BL100 is proportional to a square of the Euclidean distance between a data point of the store bits X1_100-X256_100 and the data point of the input bits Y1-Y256.

Referring to FIG. 4A and FIG. 8, each of the memory string pairs MSP1_100-MSP256_100 is an embodiment of the memory string pair MSP1. The bit line signal BL100 corresponds to the bit line signal BL. Therefore, some descriptions are not repeated for brevity.

Similarly, during the search operation, the memory string pairs MSP1_128K-MSP256_128K are configured to compare the store bits X1_128K-X256_128K and the input bits Y1-Y256 to generate the bit line signal BL128K. At this moment, a current level of the bit line signal BL128K is proportional to a square of the Euclidean distance between a data point of the store bits X1_128K-X256_128K and the data point of the input bits Y1-Y256.

Referring to FIG. 4A and FIG. 8, each of the memory string pairs MSP1_128K-MSP256_128K is an embodiment of the memory string pair MSP1. The bit line signal BL128K corresponds to the bit line signal BL. Therefore, some descriptions are not repeated for brevity.

In summary, the 128K data points corresponding to the bit line signals BL0-BL128K can be compared with the data point of the input bits Y1-Y256 in one read cycle.

In the embodiment shown in FIG. 8, a space dimension of the store bits of the store bits and the input bits is 256, in which 256 is a half of the memory block number 512. Alternatively stated, the space dimension is defined by the memory block number. In various embodiments, for an positive integer m, a space dimension of m/2 can be implemented by opening m blocks.

In some embodiments, a square of the Euclidean distance between a data point of the store bits and a data point of the input bits can be represented by the bit line signal generated with summation of the current signals generated by the memory strings, and can be detected by sensing amplifiers (SA) in the sensing device 820. The root function performed to the square of the Euclidean distance also can be performed by the sensing amplifiers.

In some embodiments, the sensing amplifiers can define the current criteria to filter all data points, and only output highly similar data points to central processing unit (CPU) and/or graphic processing unit (GPU).

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A memory device, comprising a first memory string and a second memory string coupled in parallel with the first memory string, the first memory string comprising:

a plurality of first switch elements; and a plurality of second switch elements arranged alternately and coupled in series with the plurality of first switch elements, wherein when the first memory string has a first conductance, each switch element of the plurality of first switch elements has a first threshold voltage level and each switch element of the plurality of second switch elements has a second threshold voltage level, when the first memory string has a second conductance, each switch element of a first portion of the plurality of first switch elements has the second threshold voltage level and each switch element of a second portion of the plurality of second switch elements has the first threshold voltage level, the first conductance is smaller than the second conductance, and the first threshold voltage level is larger than the second threshold voltage level, the first memory string and the second memory string are configured to store a store bit, when the store bit has a first logic value, the first memory string and the second memory string have a third conductance and a fourth conductance, respectively, when the store bit has a second logic value, the first memory string and the second memory string have the fourth conductance and the third conductance, respectively, and the fourth conductance is larger than the third conductance.

2. The memory device of claim 1, wherein when the first memory string has the third conductance, one of the plurality of first switch elements has a third threshold voltage level, the second conductance is larger than the third conductance, and the third threshold voltage level is larger than the first threshold voltage level.

3. The memory device of claim 1, wherein when the first memory string has a fifth conductance, each switch element of a third portion of the plurality of first switch elements has the second threshold voltage level, and each switch element of a fourth portion of the plurality of second switch elements has the first threshold voltage level, the fifth conductance is larger than the second conductance, and a quantity of switch elements of the third portion is larger than a quantity of switch elements of the first portion, and a quantity of switch elements of the fourth portion is larger than a quantity of switch elements of the second portion.

4. The memory device of claim 1, wherein when the first memory string has a fifth conductance, a third switch element of the plurality of first switch elements has a third threshold voltage level, the fifth conductance is larger than the second conductance, and the third threshold voltage level is larger than the first threshold voltage level.

5. The memory device of claim 4, wherein when the first memory string has a sixth conductance, the third switch element has a fourth threshold voltage level, the sixth conductance is larger than the fifth conductance, the first threshold voltage level is larger than the fourth threshold voltage level, and the second threshold voltage level is smaller than the fourth threshold voltage level.

6. A memory device, comprising:

a first memory string configured to receive a plurality of first word line signals; and a second memory string coupled in parallel with the first memory string, and configured to receive a plurality of second word line signals, wherein the plurality of first word line signals and the plurality of second word line signals correspond to an input bit, when the input bit has a first encode value, each of a first portion of the plurality of first word line signals has a first voltage level, each of a second portion of the plurality of first word line signals has a second voltage level, and each of the plurality of second word line signals has the first voltage level, when the input bit has a second encode value, each of a third portion of the plurality of second word line signals has the first voltage level, each of a fourth portion of the plurality of second word line signals has the second voltage level, and each of the plurality of first word line signals has the first voltage level, and the first encode value is different from the second encode value, the first memory string and the second memory string are further configured to store a store bit, when the store bit has a first logic value, the first memory string and the second memory string have a first conductance and a second conductance, respectively, when the store bit has a second logic value, the first memory string and the second memory string have the second conductance and the first conductance, respectively, and the second conductance is larger than the first conductance.

7. The memory device of claim 6, wherein the second voltage level is larger than the first voltage level.

8. The memory device of claim 6, wherein when the input bit has a wildcard encode value, each of the plurality of first word line signals and the plurality of second word line signals has the first voltage level.

9. The memory device of claim 8, wherein when the input bit has the first encode value, the input bit has the first logic value, when the input bit has the wildcard encode value, the input bit has a third logic value larger than the first logic value, and the input bit has the second encode value, the input bit has the second logic value larger than the third logic value.

10. The memory device of claim 6, wherein the second conductance is proportional to a square of a difference between the second logic value and the first logic value.

11. The memory device of claim 6, wherein when the store bit has a third logic value, the first memory string and the second memory string have a third conductance and a fourth conductance, respectively, the third conductance is proportional to a square of a difference between the third logic value and the first logic value, and the fourth conductance is proportional to a square of a difference between the third logic value and the second logic value.

12. The memory device of claim 11, wherein when the store bit has a fourth logic value, the first memory string and the second memory string have a fifth conductance and a sixth conductance, respectively, the fifth conductance is proportional to a square of a difference between the fourth logic value and the first logic value, and the sixth conductance is proportional to a square of a difference between the fourth logic value and the second logic value.

13. The memory device of claim 12, wherein a difference between the fourth logic value and the third logic value is equal to the difference between the third logic value and the first logic value.

14. The memory device of claim 6, wherein the first memory string and the second memory string are further configured to generate a first string current signal and a second string current signal, when the input bit has the first encode value, a current level of the first string current signal is proportional a square of a difference between a logic value of the input bit and a logic value of the store bit, and when the input bit has the second encode value, a current level of the second string current signal is proportional the square of the difference between the logic value of the input bit and the logic value of the store bit.

15. The memory device of claim 14, wherein when the input bit has the first encode value, the second string current signal has a zero current level, and when the input bit has the second encode value, the first string current signal has the zero current level.

16. The memory device of claim 14, wherein when the input bit has a wildcard encode value, each of the first string current signal and the second string current signal has a zero current level.

17. A memory system, comprising a plurality of memory blocks configured to receive a plurality of string select line signals, respectively; and a sensing device configured to receive a plurality of bit line signals from the plurality of memory blocks, wherein the plurality of memory blocks comprises a plurality of first memory string pairs, the plurality of first memory string pairs are configured to store a plurality of first store bits, respectively, and the plurality of first memory string pairs are configured to compare the plurality of first store bits and a plurality of input bits, to generate a first bit line signal of the plurality of bit line signals, the plurality of first memory string pairs comprises a first memory string and a second memory string coupled in parallel with the first memory string, the first memory string and the second memory string are configured to store a store bit, when the store bit has a first logic value, the first memory string and the second memory string have a first conductance and a second conductance, respectively, when the store bit has a second logic value, the first memory string and the second memory string have the second conductance and the first conductance, respectively, and the second conductance is larger than the first conductance.

18. The memory system of claim 17, wherein the plurality of memory blocks further comprises a plurality of second memory string pairs, the plurality of second memory string pairs are configured to store a plurality of second store bits, respectively, the plurality of second memory string pairs are configured to compare the plurality of second store bits and the plurality of input bits, to generate a second bit line signal of the plurality of bit line signals.

19. The memory system of claim 17, wherein a quantity of the plurality of first memory string pairs is a half of a quantity of the plurality of memory blocks.

* * * * *